United States Patent [19]
Mori

[11] Patent Number: 5,438,539
[45] Date of Patent: Aug. 1, 1995

[54] MEMORY DEVICE, METHOD FOR READING INFORMATION FROM THE MEMORY DEVICE, METHOD FOR WRITING INFORMATION INTO THE MEMORY DEVICE, AND METHOD FOR PRODUCING THE MEMORY DEVICE

[75] Inventor: Toshihiko Mori, Kawasaki, Japan

[73] Assignee: Fujitsu Limited, Kawasaki, Japan

[21] Appl. No.: 299,669

[22] Filed: Sep. 2, 1994

Related U.S. Application Data

[63] Continuation of Ser. No. 126,168, Sep. 24, 1993, abandoned.

[30] Foreign Application Priority Data

Sep. 25, 1992 [JP] Japan .................................. 4-256701

[51] Int. Cl.⁶ .............................................. G11C 11/00
[52] U.S. Cl. ................................. 365/159; 365/175; 365/187
[58] Field of Search ............... 365/187, 105, 169, 175, 365/159, 168

[56] References Cited

U.S. PATENT DOCUMENTS 3,201,595 8/1965 Miller .............................. 365/175 X
3,594,737 7/1971 Haure-Touze ...................... 365/159

FOREIGN PATENT DOCUMENTS 56-080886 7/1981 Japan .................................. 365/105

OTHER PUBLICATIONS

IBM Technical Disclosure Bulletin. "Transferred-Electron Static Memory Cell". vol. 28, No. 12, May 1986.

Primary Examiner—Joseph A. Popek
Assistant Examiner—A. Zarabian
Attorney, Agent, or Firm—Staas & Halsey

[57] ABSTRACT

A memory device includes a first address signal line, a pair of second address signal lines, a standby signal line, and a memory cell provided at a cross point at which the first address signal line crosses the pair of second address signal lines. The memory cell includes first and second elements connected, via a connection node, in series between the pair of second address signal lines in a forward direction, each of the first and second elements having a negative-differential conductance characteristic. A threshold diode is connected between the first address signal line and the connection node, and has a characteristic in which a current flows in the threshold diode when a voltage applied across the threshold diode exceeds threshold voltages. A gate is connected to the standby signal line and controls currents flowing in the first and second elements.

19 Claims, 29 Drawing Sheets

— D1
··· D2      $V_{s1} < V_{AX}+V_{th1} < V_{sn} < V_{s2} < V_{AX}+V_{th2}$
··· D3
— D2−D3

— D1
··· D2   $V_{AX}+V_{th1} < V_{s1} < V_{AX}+V_{th2} < V_{s2}$
··· D3
— D2−D3

STANDBY

READ/WRITE

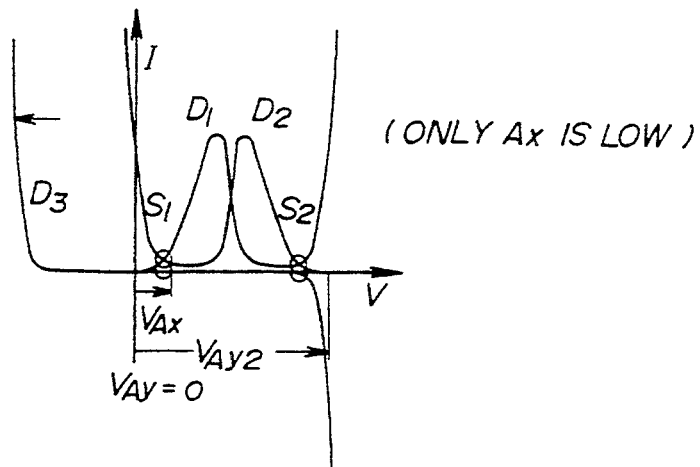
FIG.11A (ONLY Ax IS LOW)
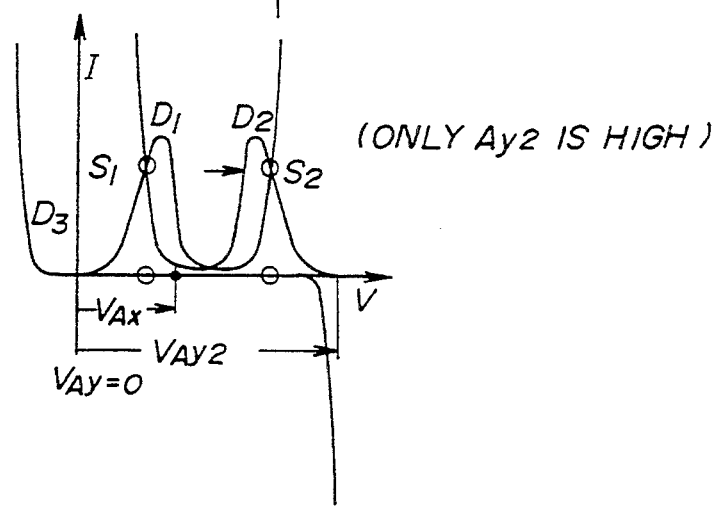
FIG.11B (ONLY Ay2 IS HIGH)
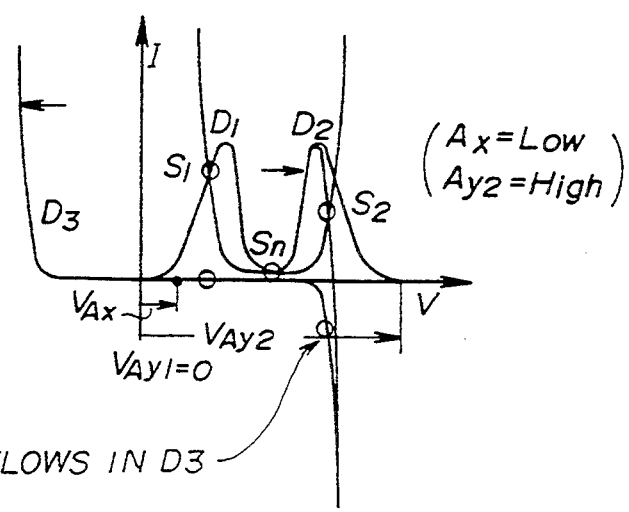
FIG.11C $\begin{pmatrix} A_x = Low \\ A_{y2} = High \end{pmatrix}$
CURRENT FLOWS IN D3

(ONLY Ax IS LOW)

(ONLY Ay2 IS HIGH)

$\begin{pmatrix} Ax = Low \\ Ay2 = High \end{pmatrix}$ (ONLY Ax IS HIGH)

(ONLY Ay1 IS LOW)

(Ax = High, Ay1 = Low)

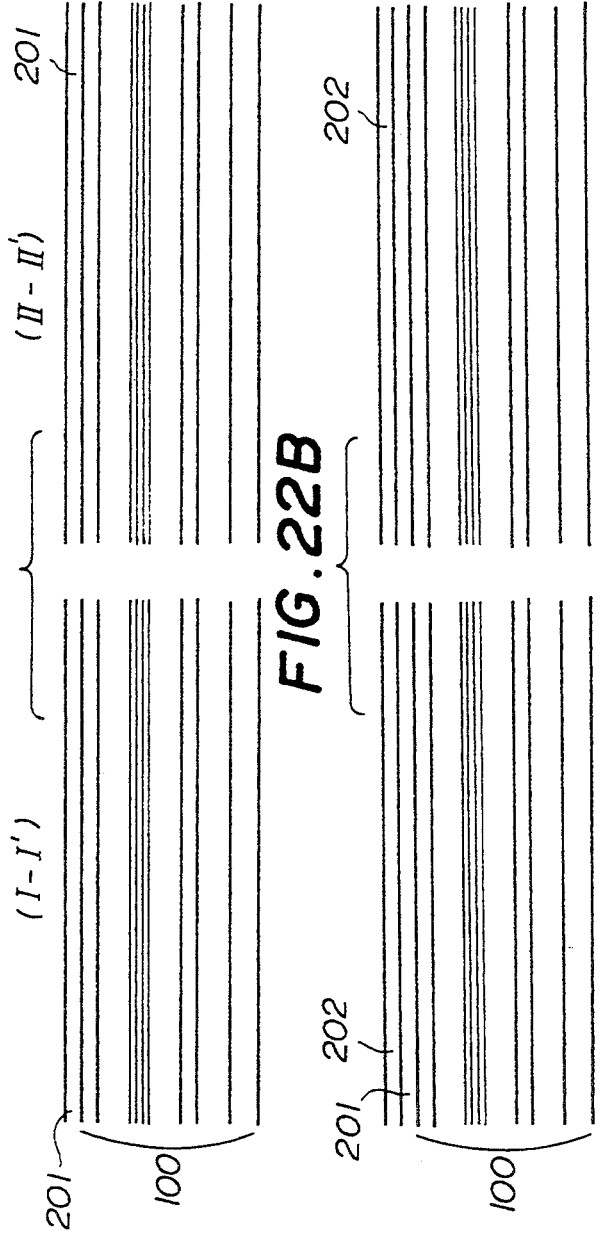

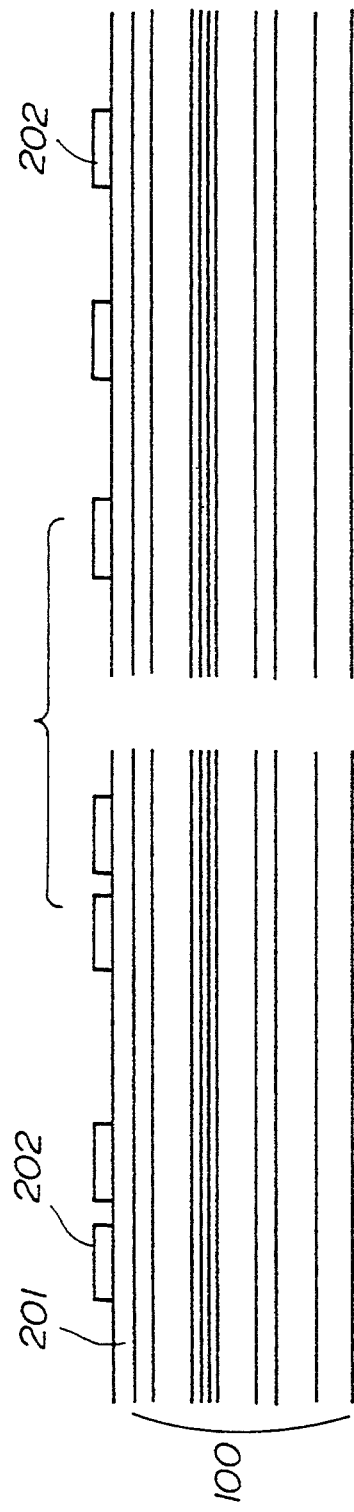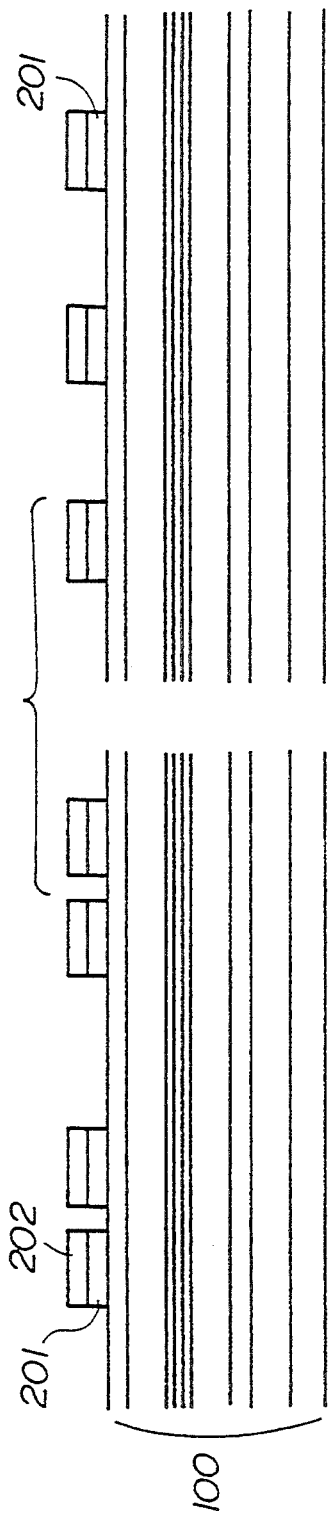

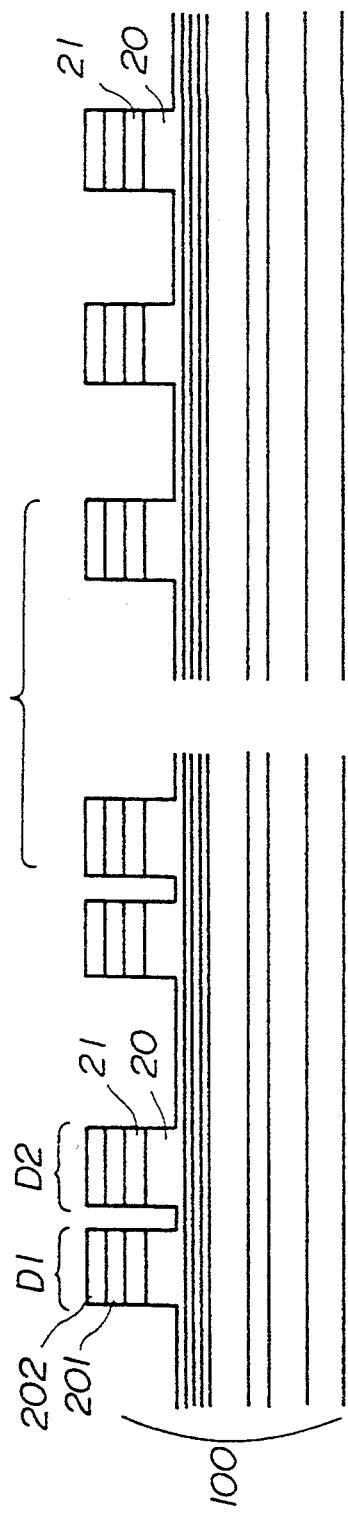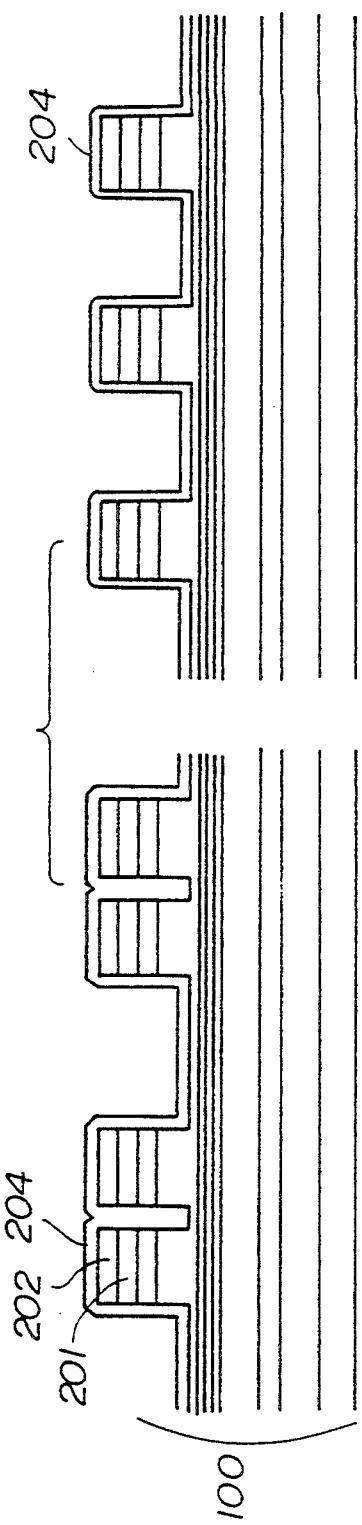

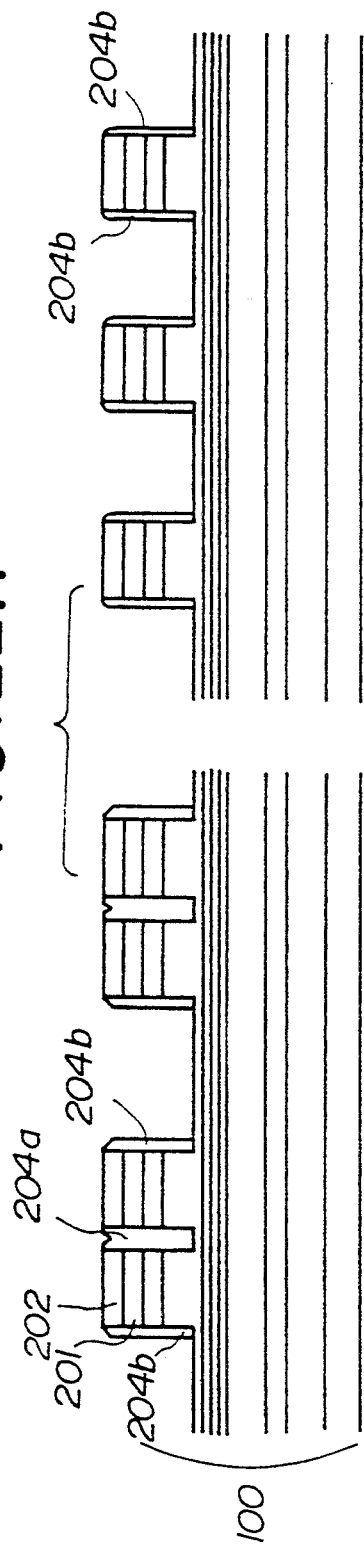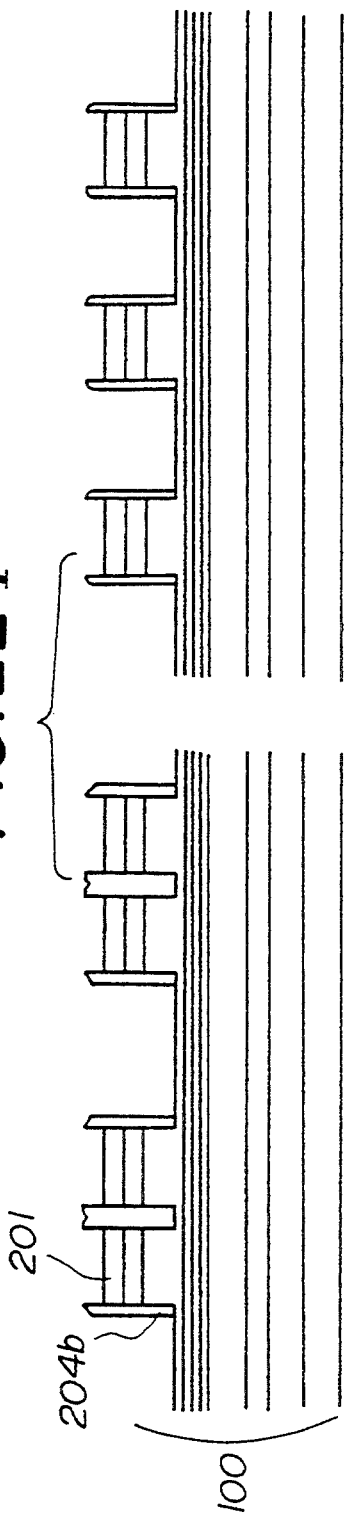

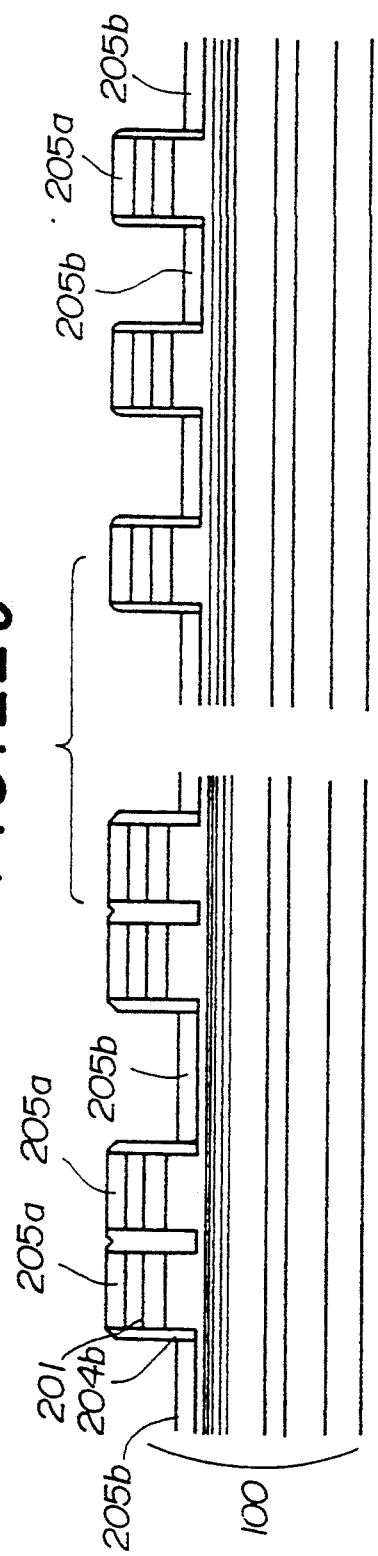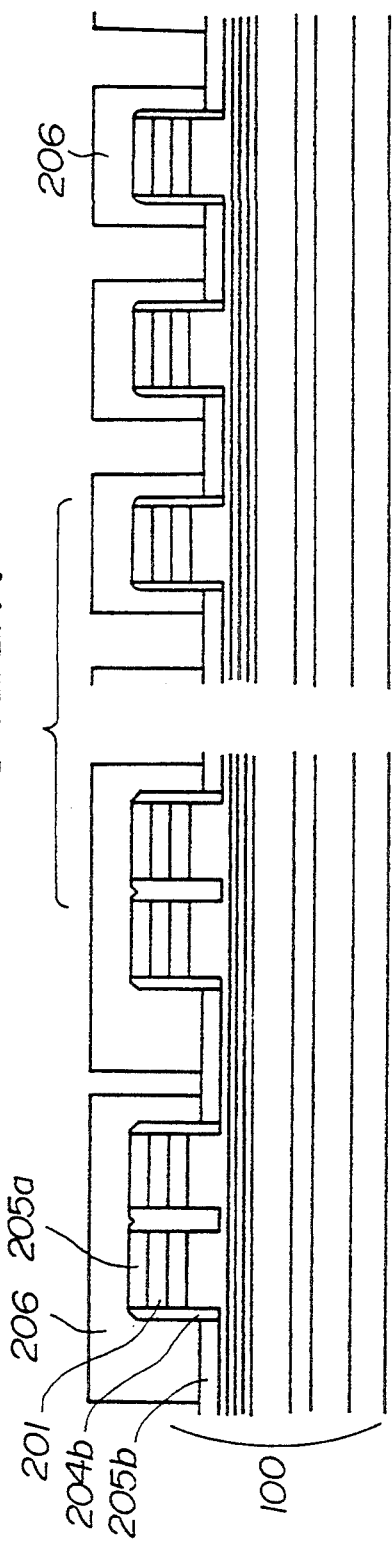

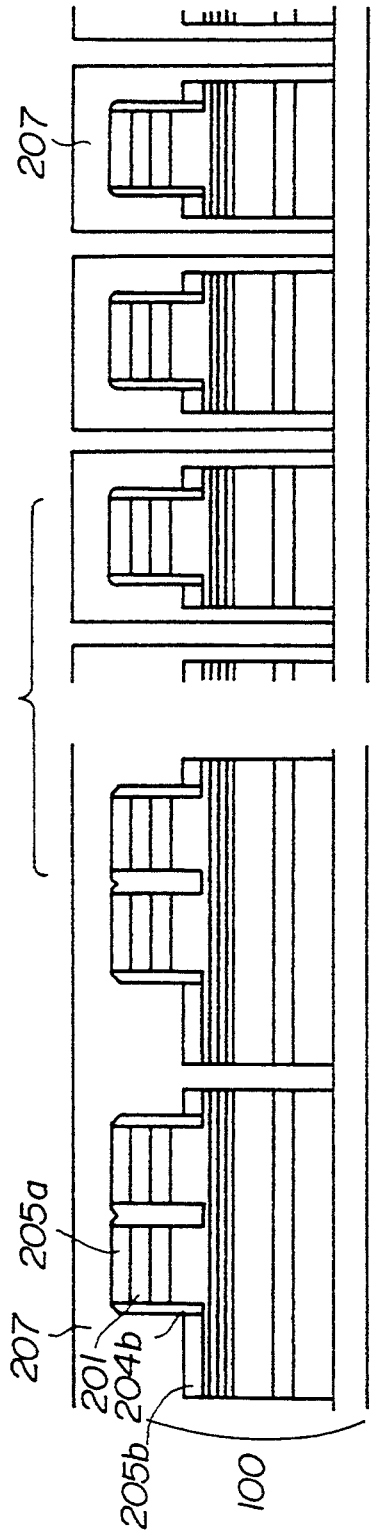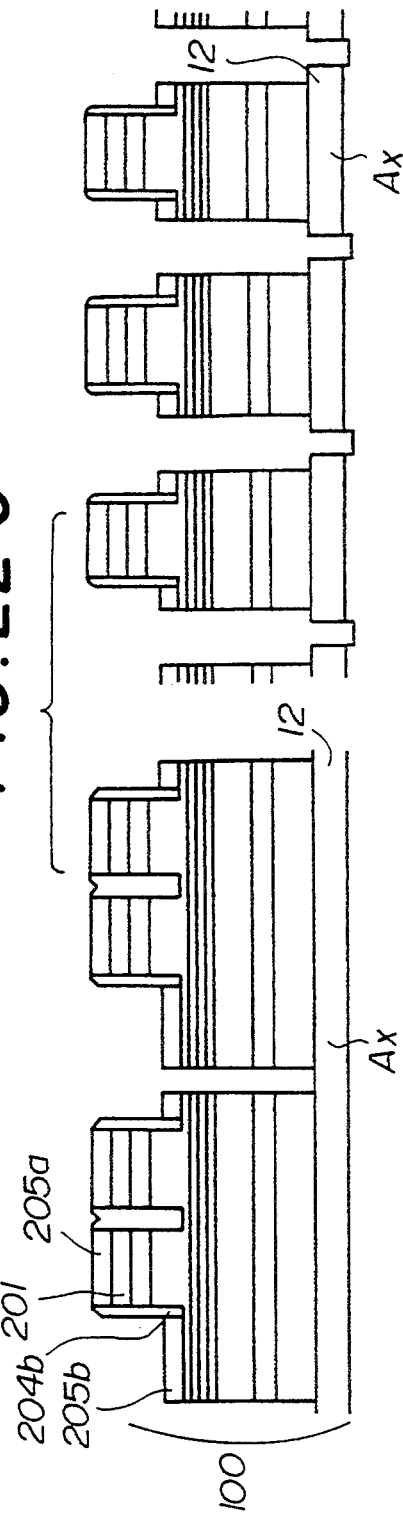

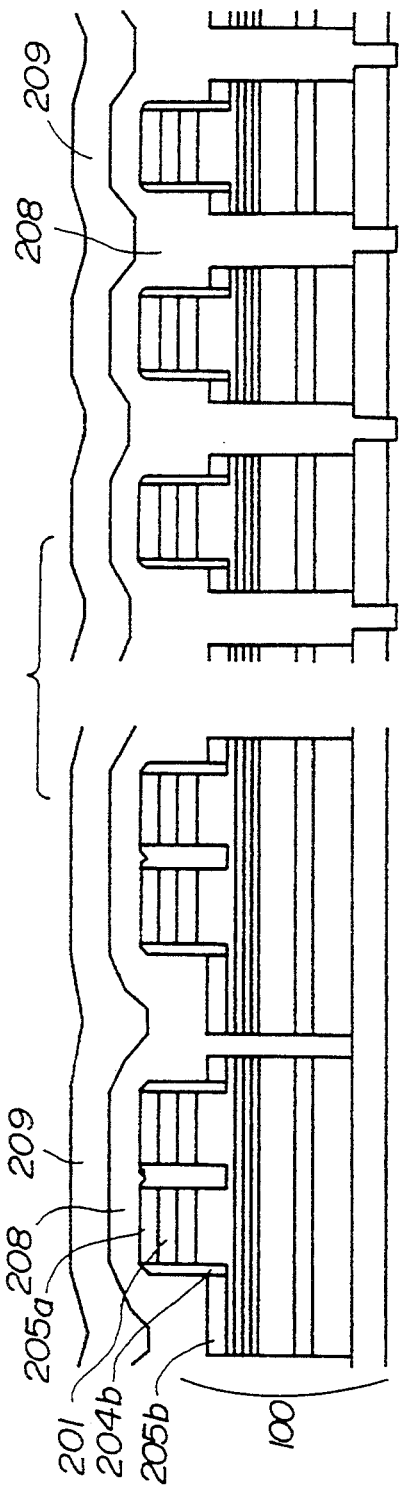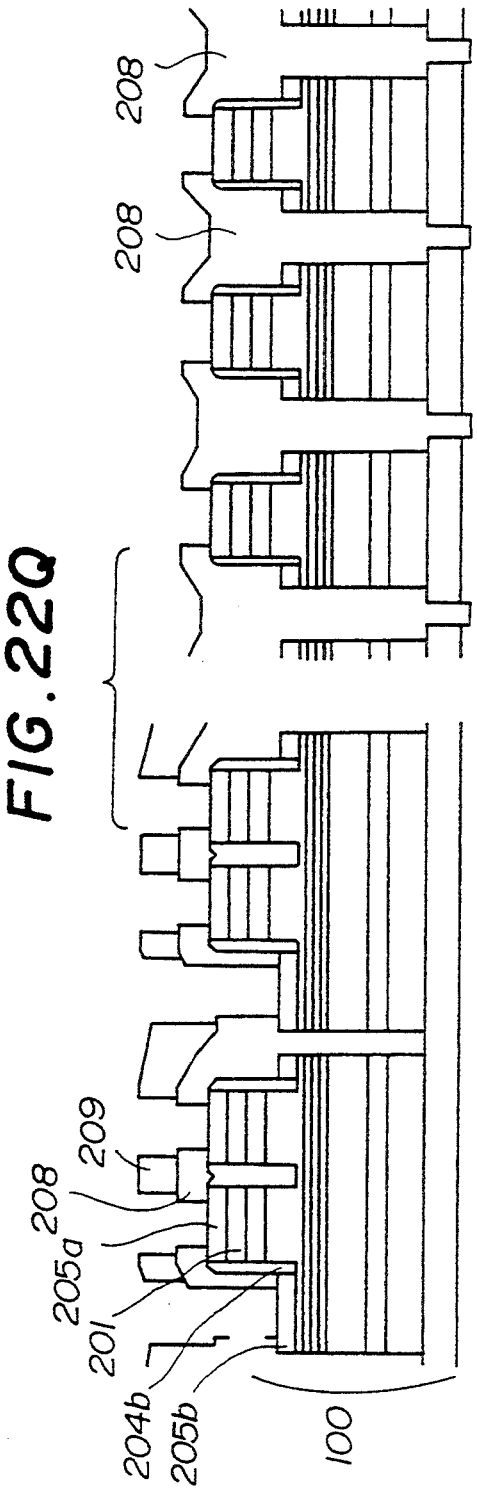

MEMORY DEVICE, METHOD FOR READING INFORMATION FROM THE MEMORY DEVICE, METHOD FOR WRITING INFORMATION INTO THE MEMORY DEVICE, AND METHOD FOR PRODUCING THE MEMORY DEVICE

This application is a continuation of application Ser. No. 08/126,168, filed Sep. 24, 1993, now abandoned.

BACKGROUND OF THE INVENTION

1. Field of the Invention

The present invention generally relates to memory devices and more particularly, to a memory device having negative-differential conductance diodes and a threshold diode. Further, the present invention is concerned with a method for reading information from such a memory device and writing information into the memory device, and a method for producing the memory device.

Recently, there has been considerable activity in the development of large-scale semiconductor memories, such as 64 Mbit DRAMs (Dynamic Random Access Memories) and 16 Mbit SRAMs (Static Random Access Memories). However, current memory cell structures have a limited integration density, and it is hence desired to develop novel semiconductor memory cells having a higher integration density.

2. Description of the Prior Art

Generally, a memory cell of DRAMs has a capacitor which utilizes a junction capacitance of an FET (Field Effect Transistor) for storing information, and an FET for reading information from the junction capacitance and writing infomation therein. A memory cell of SRAMs has a flip-flop type memory cell structure, which is normally made up of six FETs.

The SRAM memory cell needs an area occupied by at least six FETs and hence has a limit regarding the integration density.

SUMMARY OF THE INVENTION

It is an object of the present invention to provide a novel and useful memory device which is made up of a smaller number of elements than the number of elements used to form the SRAM memory cell and which occupies a reduced area.

The above object of the present invention is achieved by a memory device comprising: a first address signal line; a pair of second address signal lines; a standby signal line; and a memory cell provided at a pair of cross points at which the first address signal line crosses the pair of second address signal lines, the memory cell comprising: first and second elements connected, via a connection node, in series between the pair of second address signal lines in a forward direction, each of the first and second elements having a negative-differential conductance characteristic; a threshold diode connected between the first address signal line and the connection node, the threshold diode having a characteristic in which a current flows in the threshold diode when a voltage applied across the threshold diode exceeds a specified one of plural threshold voltages; and a gate which is connected to the standby signal line and controls currents flowing in the first and second elements.

The first and second elements connected in series have bi-stable states. Even when voltage signals are independently applied to the first address signal line and the pair of second address signal lines at respective timings, the bi-stable states are not destroyed. When predetermined voltage signals are simultaneously applied to the first address signal line and the pair of second address signal lines, a current flowing in the threshold diode is generated, or the memory cell is switched from one of the two stable states to the other stable state. That is, when a plurality of memory cells, each having the above structure, are arranged in rows and columns, information can be written into or read from only a specific memory cell. Further, use of the gate decreases the electrical energy consumed in the memory cell in a standby mode (in other words, an information holding mode), and increases the read/write operation speed.

Another object of the present invention is to provide a method for reading information from the above memory device.

This object of the present invention is achieved by applying voltages to the first address signal line and the pair of second address signal lines, so that two stable operating points and an unstable operating point are formed by a series circuit of the first and second elements in accordance with the voltages applied to the pair of second address signal lines; a potential of the connection node, corresponding to one of the stable operating points with respect to the first address signal line, is outside a voltage range between the negative threshold voltage and the positive threshold voltage in accordance with the voltage applied to the first address signal line; and a potential of the connection node corresponding to the unstable operating point, with respect to the first address signal line, is within the voltage range in accordance with the voltage applied to the first address signal line.

Preferably, the above step comprises: (a) applying the voltages to the first address signal line and the pair of second address signal lines so that the potential of the connection node corresponding to one of the two stable operating points on a negative-potential side with respect to the first address signal line is lower than the negative threshold voltage and the potential of the connection node corresponding to the unstable operating point with respect to the first address signal line is higher than the negative threshold voltage when information, corresponding to the above one of the two stable operating points on the negative-potential side, is read from the memory cell; (b) applying the voltages to the first address signal line and the pair of second address signal lines so that the potential of the connection node corresponding to one of the stable operating points, on a positive-potential side with respect to the first address signal line, is higher than the negative threshold voltage and the potential of the connection node, corresponding to the unstable operating point with respect to the first address signal line, is lower than the negative threshold voltage when information, corresponding to the above one of the two stable operating points on the positive-potential side, is read from the memory cell; (c) applying a first voltage to the standby signal line so that currents flowing in the first and second elements are increased in the steps (a) and (b); and (d) applying a second voltage to the standby signal line so that the currents flowing in the first and second elements are decreased when information is held in the memory cell.

Yet another object of the present invention is to provide a method for writing information into the above memory device.

This object of the present invention is achieved by applying voltages to the first address signal line and the pair of second address signal lines so that two stable operating points and an unstable operating point are formed by a series circuit of the first and second elements in accordance with the voltages applied to the pair of second address signal lines; and a potential of the connection node corresponding to the unstable operating point with respect to the first address signal line, is outside a voltage range between the negative threshold voltage and the positive threshold voltage in accordance with the voltage applied to the first address signal line.

Preferably, the above step comprises the steps of (a) applying the voltages to the first address signal line and the pair of second address signal lines so that the potential of the connection node corresponding to the unstable operating point with respect to the first address signal line is higher than the positive threshold voltage when information corresponding to the above one of the two stable operating points on the negative-potential side is written into the memory cell; (b) applying the voltages to the first address signal line and the pair of second address signal lines so that the potential of the connection node corresponding to the unstable operating point with respect to the first address signal line is lower than the negative threshold voltage when information, corresponding to the one of the two stable operating points on the positive-potential side, is written into the memory cell; and (c) applying a voltage to the standby signal line so that currents flowing in the first and second elements are increased in the steps (a) and (b) and when information is held in the memory cell.

A further object of the present invention is to provide a semiconductor memory device having a plurality of memory cells, each having the above-mentioned structure.

This object of the present invention is achieved by a semiconductor memory device comprising a plurality of first address signal lines; a plurality of pairs of second address signal lines; a plurality of standby signal lines extending in parallel with the plurality of pairs of second address signal lines; a plurality of memory cells provided at cross points at which the plurality of first address signal lines and the plurality of pairs of second address signal line cross; first address decoder means for supplying first address signals to the plurality of first address signal lines; second address decoder means for supplying second address signals to the plurality of pairs of second address signal lines and for supplying standby signals to the plurality of standby signal lines; and sense amplifier means for sensing information read from the memory cells to the plurality of first address signal lines. Each of the memory cells has the above-mentioned configuration.

A still further object of the present invention is to provide a method of producing the above memory device.

This object of the present invention is achieved by a method of producing a memory device, comprising the steps of (a) forming a first address signal line layer; (b) forming a layer structure of a threshold diode on the first address signal line layer, the layer structure of the threshold diode having a single-barrier layer; (c) forming a layer structure of a first element and a layer structure of a second element on the layer structure of the threshold diode, each of the first and second elements having a negative-differential conductance characteristic, and the layer structure of each of the first and second elements including a double-barrier layer and a gate electrode located at a level higher than that of the double-barrier layer; and (d) forming a pair of second address signal line layers on the layer structures of the first and second elements.

BRIEF DESCRIPTION OF THE DRAWINGS

Other objects, features and advantages of the present invention will become more apparent from the following detailed description when read in conjunction with the accompanying drawings, in which:

FIGS. 11A, 11B and 11C are graphs indicating a read operation in which information is read from the other stable operating point S2;

FIGS. 22A, 22B, 22C, 22D, 22E, 22F, 22G, 22H, 22I, 22J, 22K, 22L, 22M, 22N, 22O, 22P, 22Q, 22R and 22S are cross-sectional views of a method for producing the semiconductor memory device according to the present invention.

DESCRIPTION OF THE PREFERRED EMBODIMENTS

[I] MEMORY CELL

A description will now be given of a memory cell according to an embodiment of the present invention.

(i) CIRCUIT CONFIGURATION OF MEMORY CELL

Figure 1:
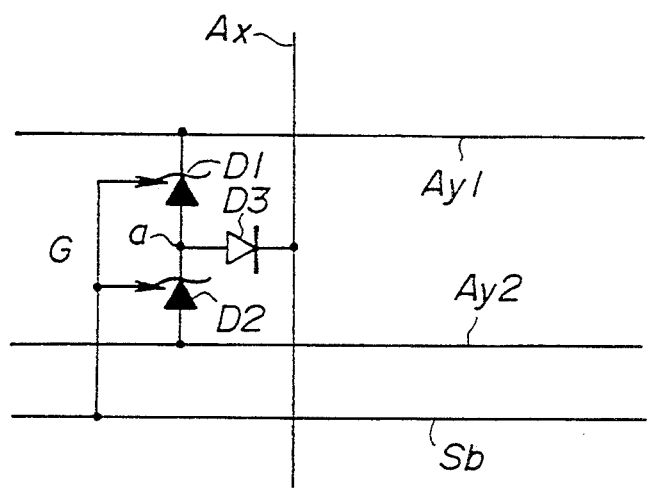
FIG. 1 is an equivalent circuit diagram of a memory cell according to the present invention.

FIG. 1 shows the circuit configuration of a memory cell according to an embodiment of the present invention. Referring to FIG. 1, a row address signal line Ax is disposed in a row (X direction), and a pair of column address signal lines Ay1 and Ay2 are disposed so that these column address signal lines cross the row address signal line Ax without electric contacts at cross points. A standby signal line Sb is disposed in parallel with the column address signal lines Ay1 and Ay2.

Two negative-differential conductance diodes D1 and D2 are connected in series between the column address signal lines Ay1 and Ay2. A threshold diode D3 is connected between a connection node at which the negative-differential conductance diodes D1 and D2 are connected together and the row address signal line Ax. A gate G, which controls currents flowing in the negative-differential conductance diodes D1 and D2, is applied through the standby signal line Sb to the diodes D1 and D2. A memory cell is made up of the negative-differential conductance diodes D1 and D2, the threshold diode D3, and the gate G.

Figure 2:
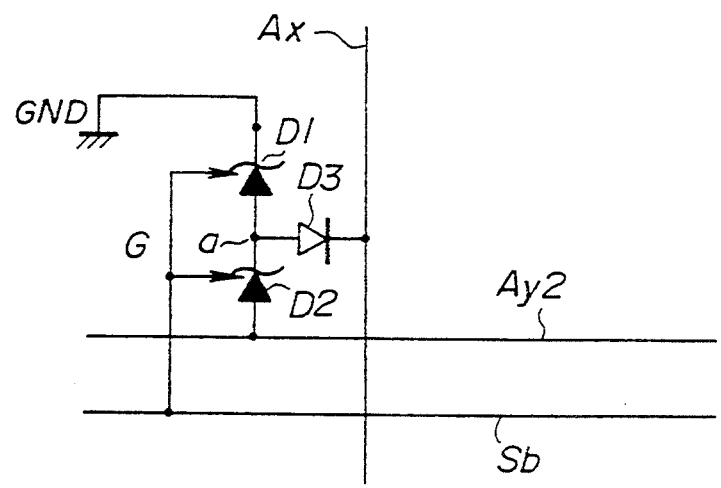
FIG. 2 is an equivalent circuit diagram of another memory cell according to the present invention.

FIG. 2 shows a variation of the circuit 5 configuration shown in FIG. 1, in which the column address signal line Ay1 is set at a ground potential GND, so that column address signal lines Ay1 are common to other memory cells.

(ii) OPERATING PRINCIPLE OF MEMORY CELL

Figure 3A:
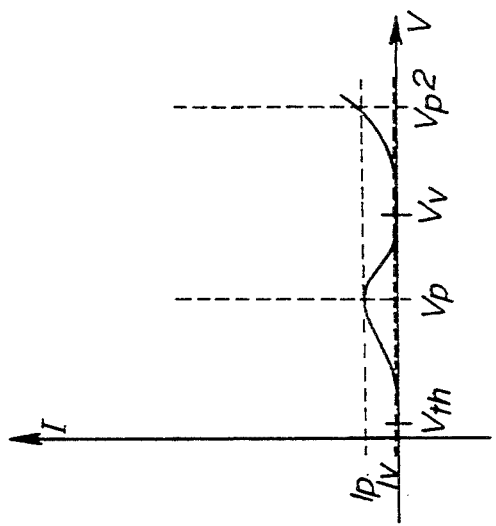
FIGS. 3A and 3B are graphs of static characteristics of a negative-differential conductance diode.
Figure 3B:
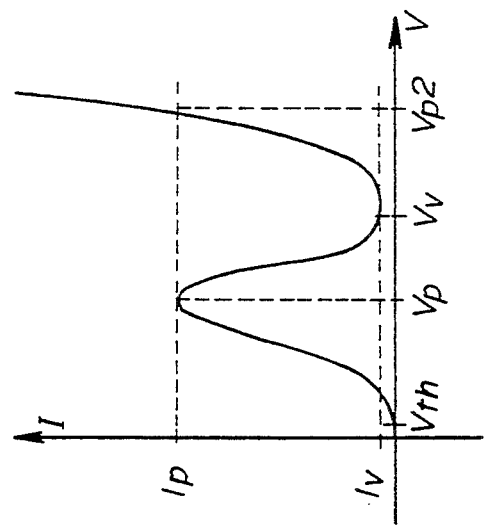

FIGS. 3A and 3B are graphs of current-voltage characteristics of an N-type negative-differential conductance diode. More particularly, FIG. 3A is a graph of a current-voltage characteristic when no voltage is applied to the standby signal line Sb, that is, when the gate G is set at a potential of zero. In this case, there is no change in the current flowing in the negative-differential conductance diodes D1 and D2. FIG. 3B is a graph of a current-voltage characteristic when a predetermined negative voltage is applied to the standby signal line Sb, that is, when the gate G1 is set at a negative potential, and the currents flowing in the negative-differential conductance diodes D1 and D2 are reduced due to an extension of a depletion layer from the gate G.

The N-type negative-differential conductance diode is, for example, an Esaki diode or a resonant-tunneling diode. Several parameters will now be defined as follows:

Ip: peak current
Iv: valley current
Vth: threshold voltage
Vp: peak voltage
Vv: valley voltage
Vp2: voltage at which the same current as the peak current Ip flows after the current starts to flow.

It will be noted that when the negative-differential conductance diode is formed of a resonant-tunneling diode, a condition $Vp-Vth > Vv-Vp$ is satisfied. Though a condition different from the above condition may be satisfied in some cases, the essence of the following description of the diode formed with a resonant-tunneling diode holds true for such different cases except for voltages to be considered. Further, in one case, the current, even though increased as the voltage is increased over a valley of the characteristic curve, does not reach the peak current. In such a case, the voltage Vp2 is defined as an infinite voltage.

Figure 5:
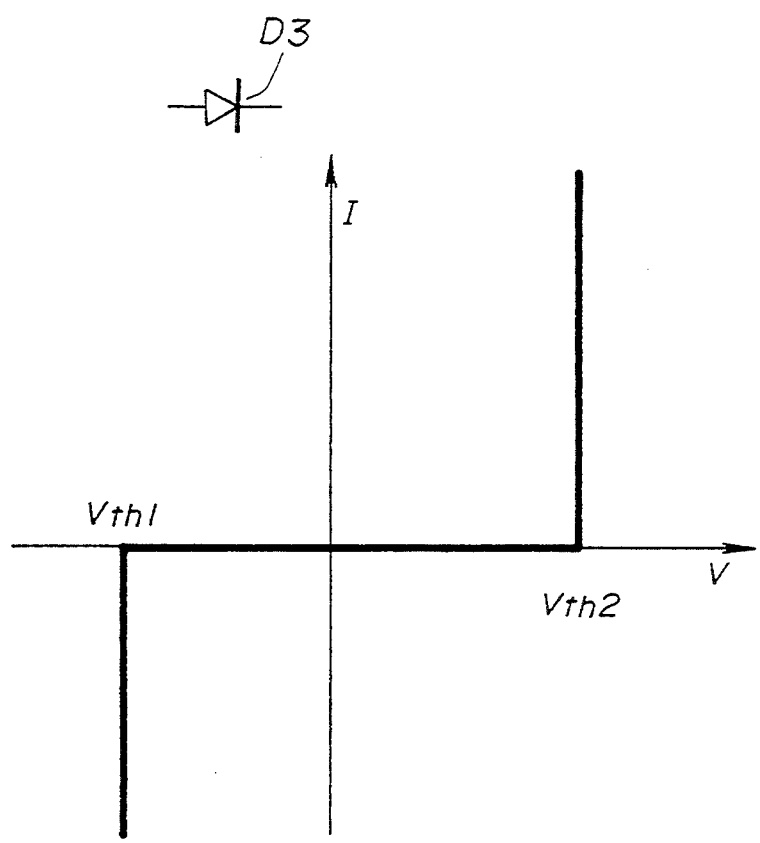
FIG. 5 is a graph of a static characteristic of a threshold diode.

FIG. 5 is a graph of a current-voltage characteristic of a threshold diode. A current abruptly flows, at a first voltage lower than a threshold voltage Vth1 or a second voltage higher than a threshold voltage Vth2. The following condition is satisfied between the threshold voltages Vth1 and Vth2 of the threshold diode D3 and the valley voltage Vv of the negative-differential conductance diodes D1 and D2:

$$|Vth1 - Vth2| > Vv.$$

Figure 4A:
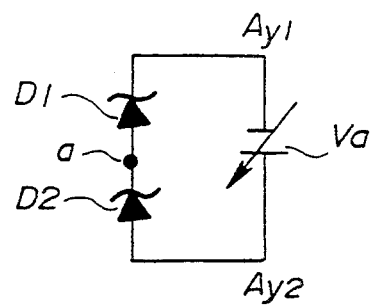
FIG. 4A is a circuit diagram of a circuit having two negative-differential conductance diodes connected in series.

As shown in FIG. 4A, two N-type negative-differential conductance diodes D1 and D2 (it will now be assumed, for the sake of simplicity, that the diodes D1 and D2 have identical characteristics and the potential of the gate G is zero) are connected in series, and terminals of the diodes D1 and D2 that are not connected together are connected to the column address signal line Ay1 (D1 side) and the column address signal line Ay2 (D2 side).

Figure 4B:
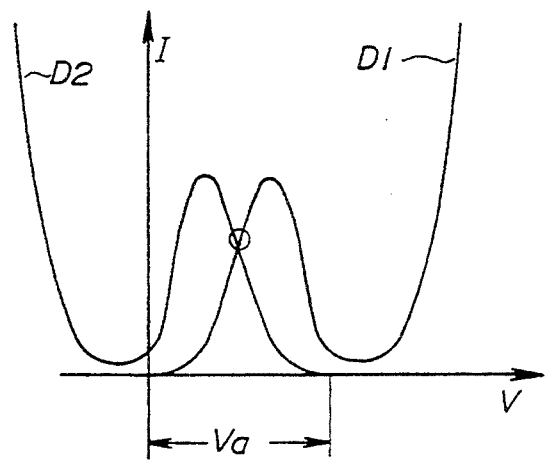
FIGS. 4B and 4C are graphs of dynamic characteristics of the circuit shown in FIG. 4A.
Figure 4C:
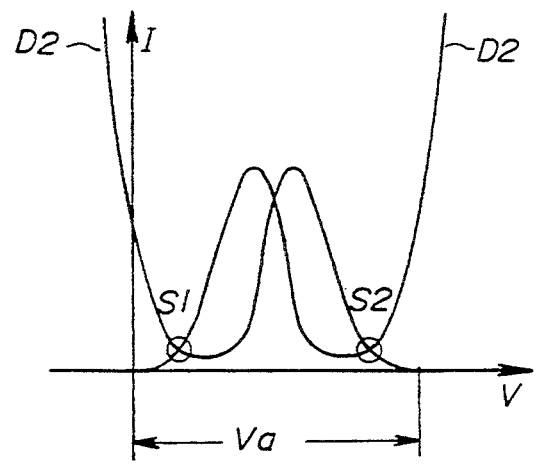

Referring to a graph of FIG. 4B, the vertical axis of the graph denotes currents I flowing in the diodes D1 and D2, and the horizontal axis thereof denotes a voltage Va with respect to a voltage of a connection node a shown in FIG. 4A. The diode D1 has an approximately N-shaped characteristic curve along which the current I changes as the potential of the connection node a is increased. The diode D2 has an approximately N-shaped characteristic curve along which the current I changes as the potential of the connection node a becomes lower than the voltage Va. As a voltage is applied across the address signal lines Ay1 and Ay2, there is a single stable operating point when the applied voltage Va is equal to or lower than 2 Vp (see FIG. 4B). As the applied voltage Va is further increased over 2 Vp, two stable operating points appear (FIG. 4C). In one of the two stable operating points, the voltage applied to the diode D1 is lower than the peak voltage and the voltage applied to the diode D2 is higher than the valley voltage. In the other stable operating point, the voltage applied to the diode D2 is lower than the peak voltage and the voltage applied to the diode D1 is higher than the valley voltage. Hence, it is possible to store information on the basis of in which one, of the two stable states, the state of the circuit shown in FIG. 4A is maintained.

In order to form a memory cell by utilizing the circuit configuration shown in FIG. 4A, the threshold diode D3 is connected between the connection node a (between the two negative-differential conductance diodes D1 and D2) and the row address signal line Ax. It will be noted that the row address signal line Ax corresponds to a bit line, and the column address signal lines Ay1 and Ay2 correspond to a pair of word lines.

Figure 6:
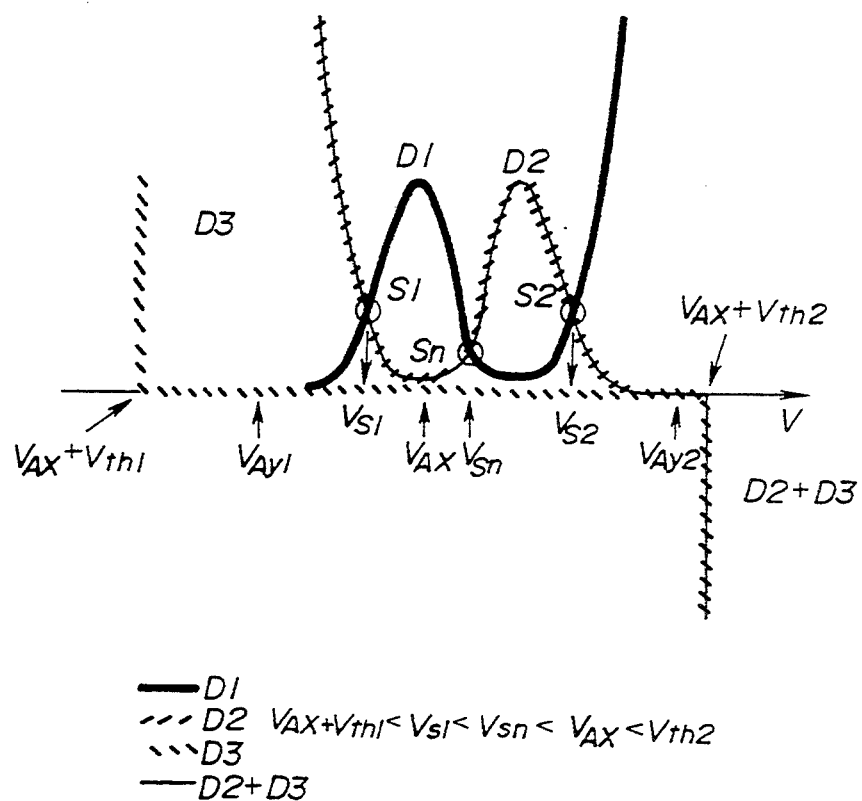
FIG. 6 is a graph indicating an information holding condition for holding information in a memory cell.
Figure 7A:
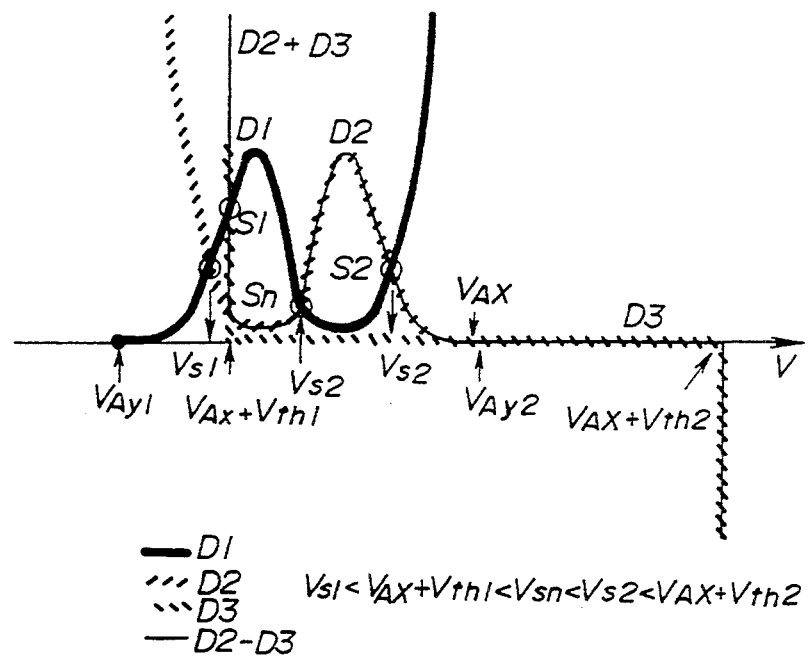
FIGS. 7A and 7B are graphs indicating conditions for reading information from two stable operating points of the memory cell.
Figure 7B:
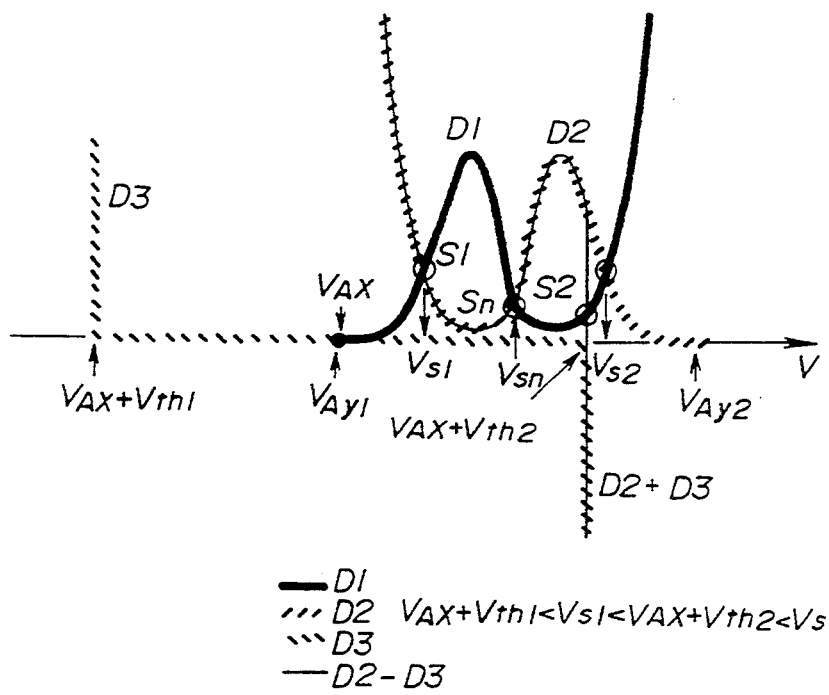
Figure 8A:
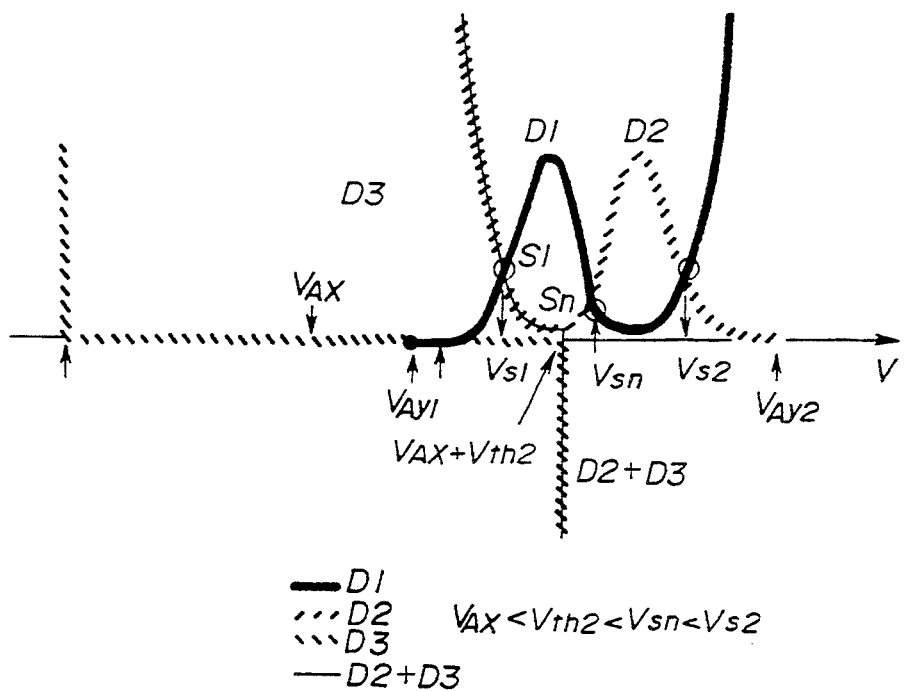
FIGS. 8A and 8B are graphs indicating conditions for writing information into two stable operating points of the memory cell.
Figure 8B:
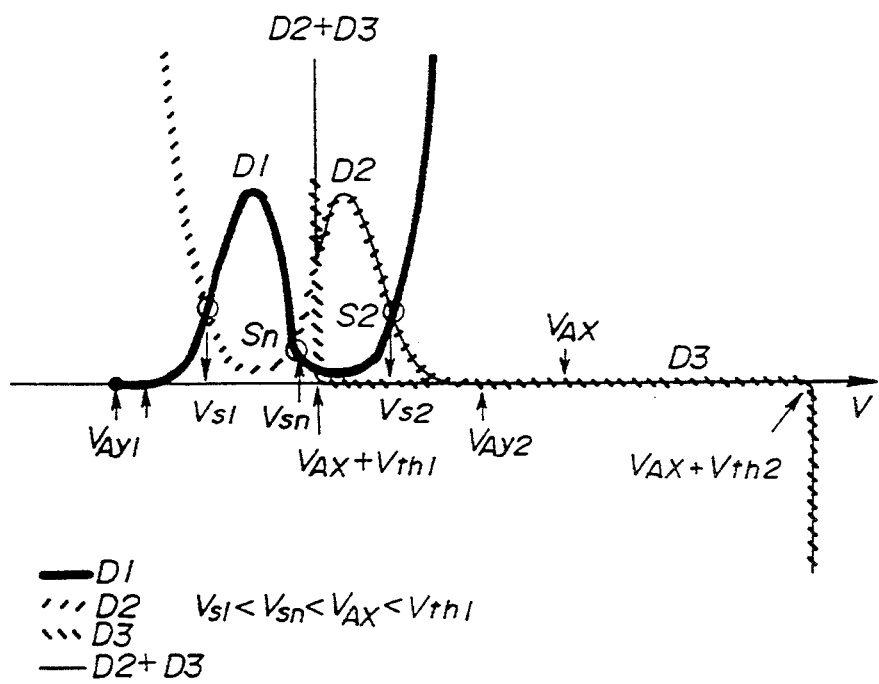

A condition for storing information in the memory cell shown in FIG. 1 is shown in FIG. 6, a condition for reading information from the memory cell is shown in FIGS. 7A and 7B, and a condition for writing information into the memory cell is shown in FIGS. 8A and 8B.

FIGS. 6, 7A, 7B, 8A and 8B show what currents flow in the diodes D1, D2 and D3 with respect to the potential of the connection node a when the potentials of the column address signal lines Ay1 and Ay2 and the row address signal line Ax are determined. In the forward direction of the diode D1, a current flows from the connection node a to the column address signal line Ay1. In the forward directions of the diodes D2 and D3 and the combination thereof, D2+D3, currents flow to the connection node a. Hence, cross points, at which the characteristic curves of D1 and D2+D3 cross each other, correspond to operating points of the memory cell.

In order to hold information stored in the memory cell, as shown in FIG. 6, it is necessary to determine the potentials of the lines Ax, Ay1 and Ay2 so that there are two stable operating points S1 and S2 and no current flows in the threshold diode D3 in the stable operating points S1 and S2.

In order to determine whether or not information has been held at the stable operating point S1 (read operation), as shown in FIG. 7A, it is necessary determine the potentials of the lines Ax, Ay1 and Ay2 so that there are two stable operating points and a current flows in the diode D3 when information has been held at the stable operating point S1, while no current flows in the diode D3 when information has not been held at the stable operating point S1 (in other words, information has been held at the stable operating point S2). Further, in order to write information into the stable operating point S1, as shown in FIG. 8B, it is necessary to determine the potentials of the lines Ax, Ay1 and Ay2 so that there is only the stable operating point S2.

In order to determine whether or not information has been held at the stable operating point S2 (read operation), as shown in FIG. 7B, it is necessary determine the potentials of the lines Ax, Ay1 and Ay2 so that there are two stable operating points and no current flows in the diode D3 when information has not been held at the stable operating point S2, while a current flows in the diode D3 when information has been held at the stable operating point S2. Further, in order to write information into the stable operating point S2, as shown in FIG. 8A, it is necessary to determine the potentials of the lines Ax, Ay1 and Ay2 so that there is only the stable operating point S1.

(iii) HOLDING AND READING OF INFORMATION

Figure 9A:
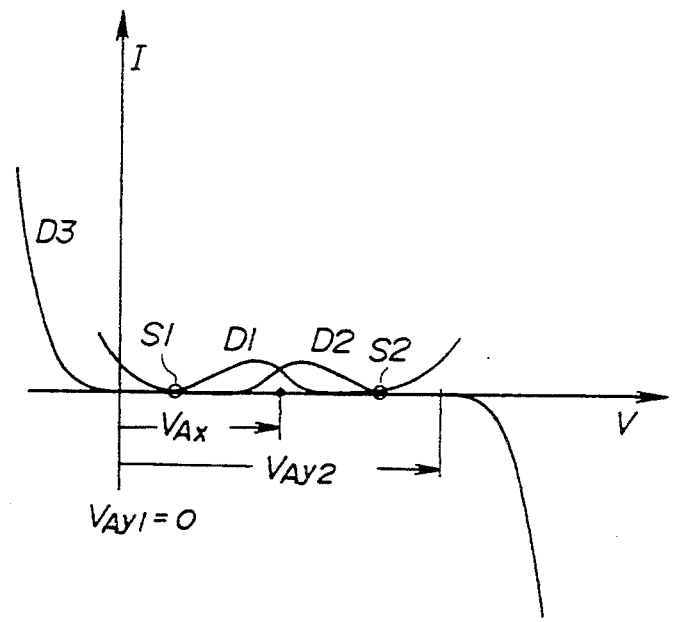
FIGS. 9A and 9B are graphs of characteristics of the memory cell which holds information.
Figure 9B:
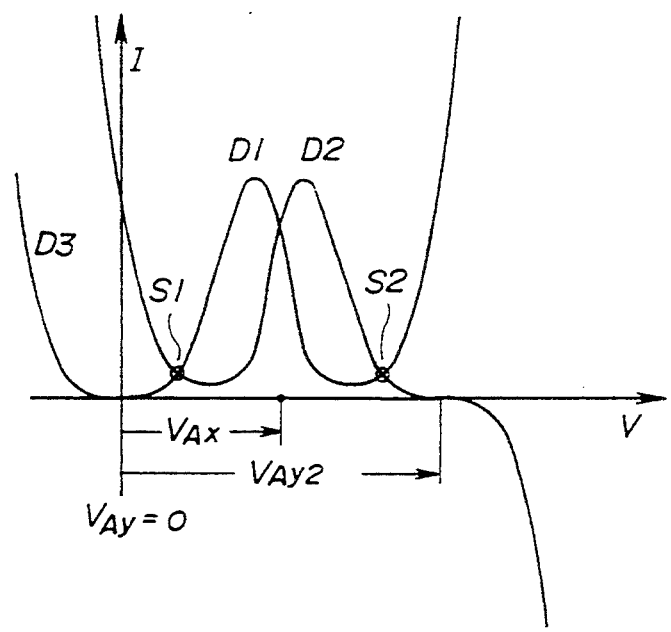

It is necessary for the memory cell to be held in the state shown in FIG. 6 in order to hold information therein. Further, it is desirable that the two stable operating points S1 and S2 are located in the valleys in order to reduce the current as much as possible and hence the power consumed in the memory cell. Such a state is shown in FIGS. 9A and 9B. FIG. 9A is a graph of a current-voltage characteristic in a standby mode in which the memory cell holds information, and FIG. 9B is a graph of a current-voltage characteristic when information is read from or written into the memory cell. In the standby or write mode shown in FIG. 9A, the gate G is set at a negative potential, and the currents flowing in the negative-differential conductance diodes D1 and D2 are reduced due to an extension of the depletion layer from the gate G. Hence, it is possible to reduce the power consumed in the standby mode. In the read mode shown in FIG. 9B, the gate G is set at a positive potential or zero, and the currents flowing in the diodes D1 and D2 are increased due to a reduction of the depletion layer. Hence, it is possible to increase the information read speed.

In FIGS. 9A and 9B, the characteristics are considered in which the threshold values are symmetrical with respect to + and − (symmetrical characteristics). If the threshold values are not symmetrical, an offset causing an intermediate potential to become zero is considered. In practice, the characteristic curve of the threshold diode does not rise as sharply as that shown in FIGS. 9A and 9B. However, the essence of the characteristic curve of the threshold diode D3 is as shown in FIGS. 9A and 9B. The above holds true for the following description.

In the read operation, it is necessary to access, from among a plurality of memory cells arranged in a matrix form, only the memory cell located at the cross point at which the row address signal line Ax and the column address signal line Ay cross. Hence, it is necessary to obtain the state shown in FIG. 6 when a signal is applied to only the row address signal line Ax or when a signal is applied to only the column address signal line Ay and to obtain the state shown in FIG. 7A or 7B when signals are applied to both the row address signal line Ax and the column address signal line Ay.

It will be noted that applying a signal to an address signal line means changing the potential of the address signal line. In this case, if the absolute value of the positive threshold value is different from that of the negative threshold value, an offset causing an intermediate potential to become zero may be considered in the following description. Hence, the following description relates to the case the positive threshold value is symmetrical relative to the negative threshold value.

Figure 10A:
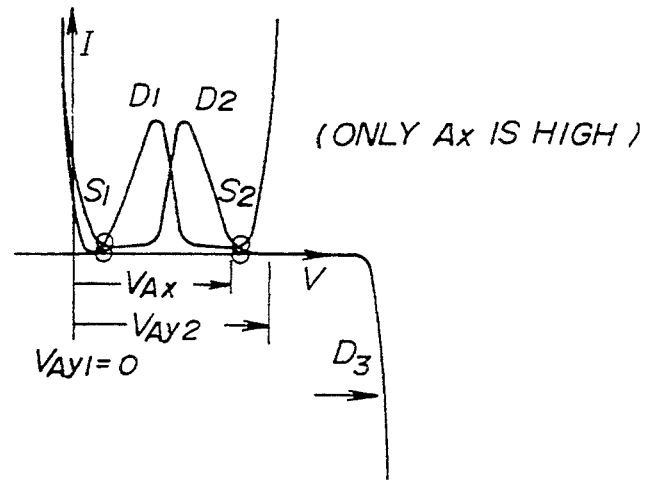
FIGS. 10A, 10B and 10C are graphs indicating a read operation in which information is read from a stable operating point S1.
Figure 10B:
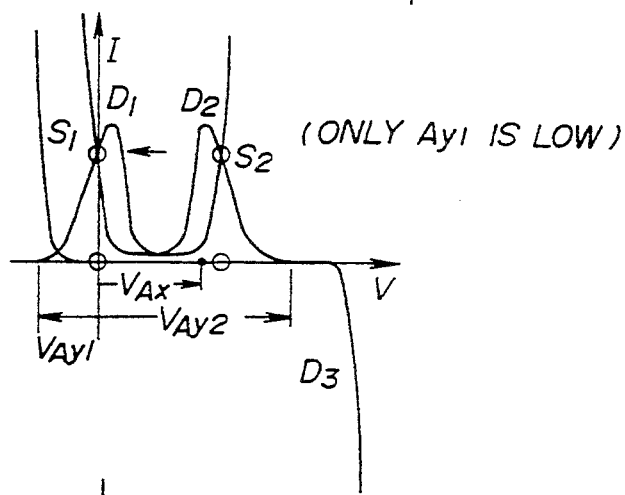
Figure 10C:
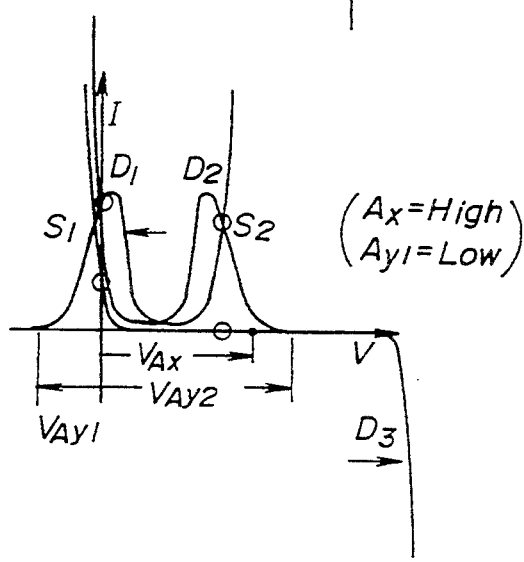

When information is read from the stable operating point S1 of the memory cell, as shown in FIGS. 10A, 10B and 10C, a high-level signal is applied to the line Ax, and/or a low-level signal is applied to the line Ay1. When the high-level signal is applied to the address signal line Ax, the characteristic curve of the threshold diode D3 is shifted rightwards, and hence the potential $VAx+Vth1$ is increased. Alternatively, when the potential $VAy1$ of the address signal line Ay1 is switched to the low level, as shown in FIG. 10B the characteristic curve of the diode D1 is shifted leftwards, and hence a potential $Vs1$ of the stable operating point S1 is decreased.

In the above operation, the magnitudes of the signals applied to the address signal lines Ax and Ay1 are determined so that a condition $VAx+Vth1<Vs1$ (that is, the state shown in FIG. 6) is satisfied when either Ax or Ay1 is switched in the above manner, and a condition $VAx+Vth>Vs1$ (theft is, the state shown in FIG. 7A) is satisfied when both the lines Ax and Ay1 are switched in the above manner. Hence, it becomes possible to select only the memory cell located at the cross point at which the row address signal line Ax and the column address signal line Ay1 cross and to read information therefrom.

In short, FIG. 10A shows a characteristic obtained when a high-level signal is applied to only the row address signal line Ax, FIG. 10B shows a characteristic obtained when a low-level signal is applied to only the column address signal line Ay1, and FIG. 10C shows a characteristic obtained when the high-level signal is applied to the row address signal line Ax and the low-level signal is applied to the column address signal line Ay1.

FIGS. 11A, 11b and 11C relate to an operation in which information is read from the stable operating point S2 of the memory cell. A low-level signal is applied to the row address signal line Ax, and a high-level signal is applied to the column address signal line Ay2. When no signals are applied to the row address signal line Ax and the column address signal line Ay2, the memory cell is in the holding state (FIG. 6) in which a condition $VAx+Vth2>Vs2$ is satisfied. When the potential of the row address signal line is switched to the low level, as shown in FIG. 11A, the characteristic curve of the diode D3 is shifted leftwards, and hence the potential $VAx+Vth2$ is decreased. When the potential $VAy2$ of the column address signal line Ay2 is switched to the high level, the characteristic curve of the diode D2 is shifted rightwards, and hence the potential Vs2 of the stable operating point S2 is increased.

In the above operation, the magnitudes of the signals applied to the address signal lines Ax and Ay2 are determined so that a condition $VAx+Vth2>Vs2$ (that is, the state shown in FIG. 6) is satisfied when either Ax or Ay2 is switched in the above manner, and a condition $VAx+Vth<Vs2$ (that is, the state shown in FIG. 7B) is satisfied when both the lines Ax and Ay2 are switched in the above manner. Hence, it becomes possible to select only the memory cell located at the cross point at which the row address signal line Ax and the column address signal line Ay2 cross and to read information therefrom.

In short, FIG. 11A shows a characteristic obtained when a low-level signal is applied to only the row address signal line Ax, FIG. 11B shows a characteristic obtained when a high-level signal is applied to only the column address signal line Ay2, and FIG. 11C shows a characteristic obtained when the low-level signal is applied to the row address signal line Ax and the high-level signal is applied to the column address signal line Ay2.

When information is read from the stable operating point S1 or S2, a positive potential or a potential of zero is applied to the standby signal line Sb. Hence, an extension of the depletion layer from the gate G can be reduced, and the currents flowing in the negative-differential conductance diodes D1 and D2 increase, as shown in FIG. 9B, and the speed at which information can be read from the stable operating point S1 or S2 can be improved.

When information is read from the stable operating point S1, an alternative condition, in which the lines Ax and Ay1 are respectively switched to high and low levels, can be employed instead of the aforementioned condition (Ax: high, Ay1: low). When information is read from the stable operating point S2, an alternative condition, in which the line Ax is switched to a low level and Ay1 and Ay2 are switched to a high level, can be employed instead of the aforementioned condition (Ax: low, Ay2: high).

In the above description, the initial state of the read operation is the same as the hold state (this is because, normally, a minimum mount of power is consumed in the hold state and the setting of another potential is not needed). However, the initial state may not necessarily coincide with the hold state as long as the above-mentioned conditions are satisfied.

(iv) WRITING OF INFORMATION

In the write operation, it is necessary to access, from among a plurality of memory cells arranged in a matrix form, only the memory cell located at the cross point at which the row address signal line Ax and the column address signal line Ay cross and write information in the selected memory cell. Hence, it is necessary to obtain the state shown in FIG. 6 when a signal is applied to only the row address signal line Ax or when a signal is applied to only the column address signal line Ay and to obtain the state shown in FIG. 8A or 8B when signals are applied to both the row address signal line Ax and the column address signal line Ay.

As has been described previously, applying of a signal to an address signal line means changing the potential of the address signal line. In this case, if the absolute value of the positive threshold value is different from that of the negative threshold value, an offset causing an intermediate potential to become zero may by considered in the following description. Hence, the following description relates to the case in which the positive threshold value is symmetrical to the negative threshold value.

Figure 12A:
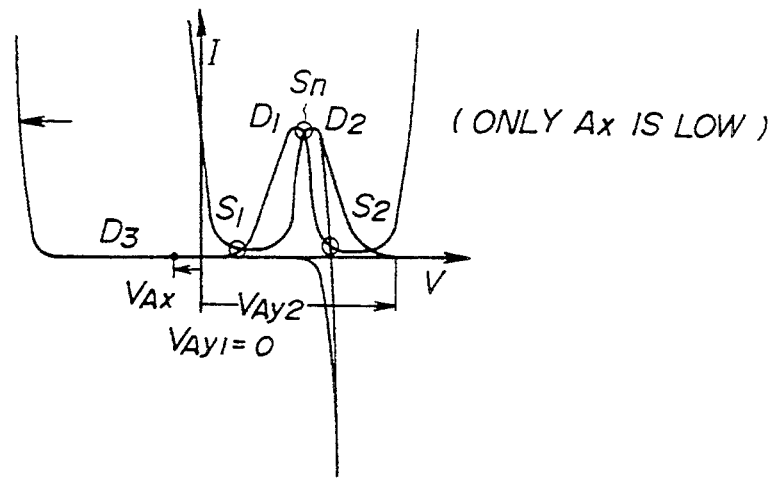
FIGS. 12A, 12B and 12C are graphs indicating a write operation in which information is written into the stable operating point S1.
Figure 12B:
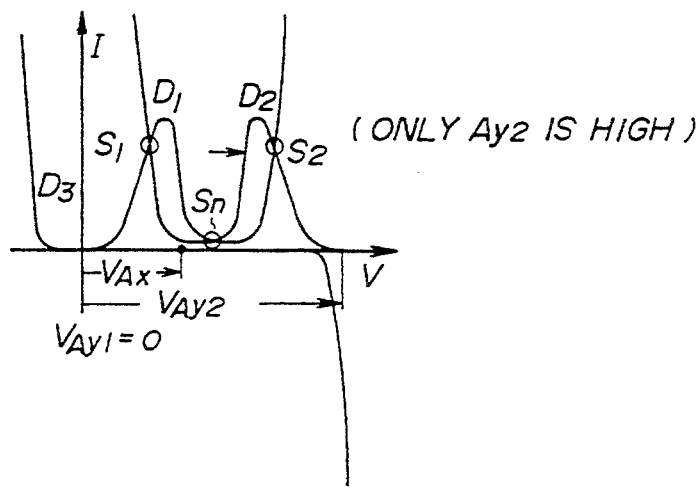
Figure 12C:
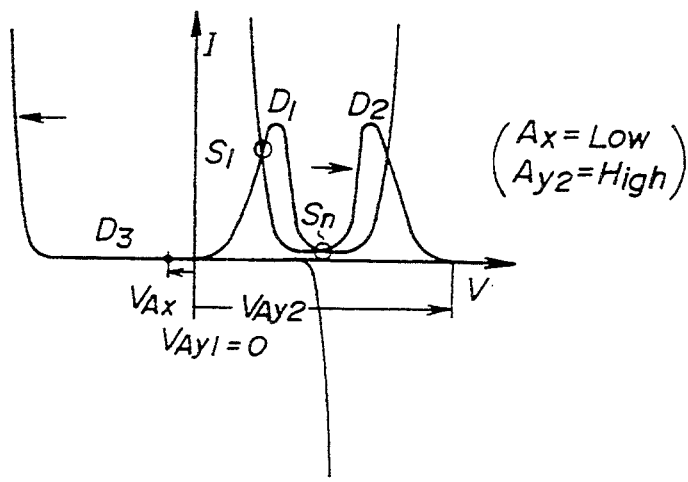

In the write operation on the stable operating point S1, a low-level signal is applied to the row address signal line Ax, and/or a high-level signal is applied to the column address signal line Ay2, as shown in FIGS. 12A, 12B and 12C. As in the case of the above, the high-level signal is applied to the column address signal line Ay2 in the read operation on the stable operating point S2 shown in FIGS. 11A, 11b and 11C. However, the magnitudes of the potentials applied in FIGS. 12A, 12B and 12C are different from those of the potentials applied in FIGS. 11A, 11b and 11C.

More particularly, as shown in FIG. 12C, the potentials of the lines Ax and Ay2 in the write operation on the stable operating point S1 are determined so that $VAx+Vth2<VSn$ is satisfied where Sn is an unstable operating point and VSn is the potential of the unstable operating point Sn. On the other hand, the potentials of the lines Ax and Ay2 in the read operation on the stable operating point S2 are determined so that $VAx+Vth2>VSn$ is satisfied. When no signals are applied to the, address signal lines Ax and Ay2, the memory cell is maintained in the hold state shown in FIG. 6. It is also possible for the memory cell to be maintained in the state shown in FIG. 7B in which the potential of the line Ax is low to some extent and the potential of the line Ay2 is high.

When the potential of the row address signal line Ax is completely switched to the low level from the hold state, as shown in FIG. 12A the characteristic curve of the diode D3 is shifted leftwards, and hence the potential $VAx+Vth2$ is decreased. On the other hand, when the potential of the address line Ay2 is switched to the high level, as shown in FIG. 12B the characteristic curve of the diode D2 is shifted rightwards, and hence the potential V2 is increased.

The magnitudes of the voltages are determined so that the condition $VAx+Vth2>VSn$ is satisfied (that is, the state shown in FIG. 6 or FIG. 7B) when either the potential of the line Ax or the potential of the line Ay2 is switched, and are determined so that the condition $VAx+Vth2<VSn$ is satisfied (that is, the state shown in FIG. 12C) when the potentials of both the lines Ax and Ay2 are switched in the above-mentioned manner. As a result, only the stable operating point S2 exists in only the memory cell connected to the address signal lines Ax and Ay2 that cross, and is located at a voltage lower than the peak voltage applied to the diode D1. When the potentials of the address signal lines Ax and Ay2 are switched to the original levels, the stable operating point is S1 and information can be written into memory cell at the stable operating point S1.

In short, FIG. 12A shows a characteristic obtained when a low-level signal is applied to only the row address signal line Ax, FIG. 12B shows a characteristic obtained when a high-level signal is applied to only the column address signal line Ay2, and FIG. 12C shows a characteristic obtained when the low-level signal is applied to the row address signal line Ax and the high-level signal is applied to the column address signal line Ay2.

Figure 13A:
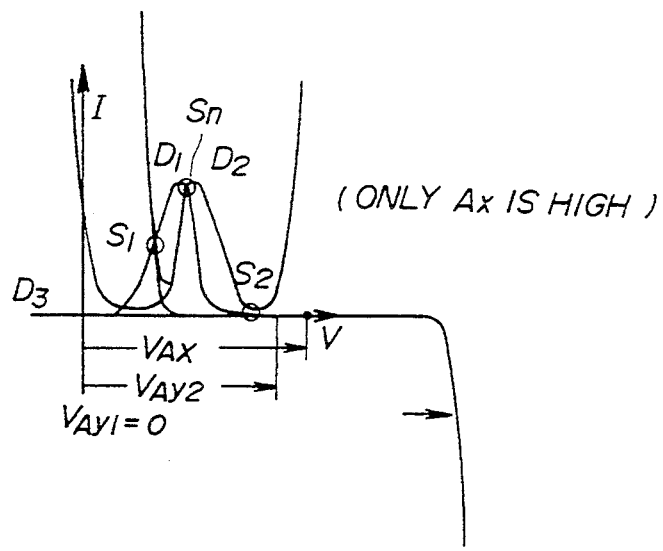
FIGS. 13A, 13B and 13C are graphs indicating a write operation in which information is written into the other stable operating point S2.
Figure 13B:
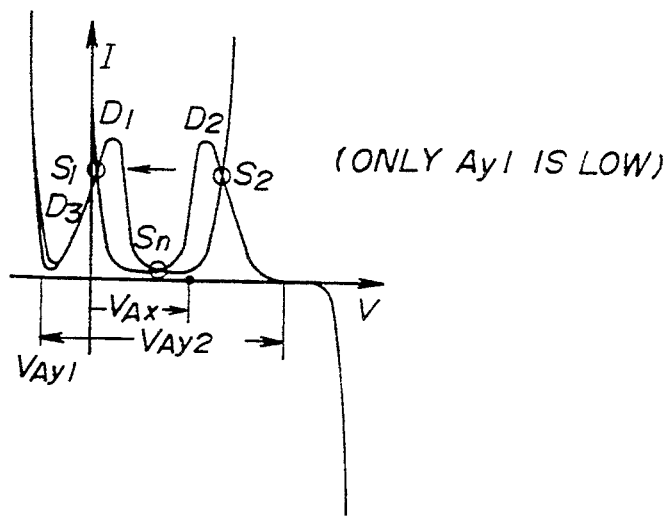
Figure 13C:
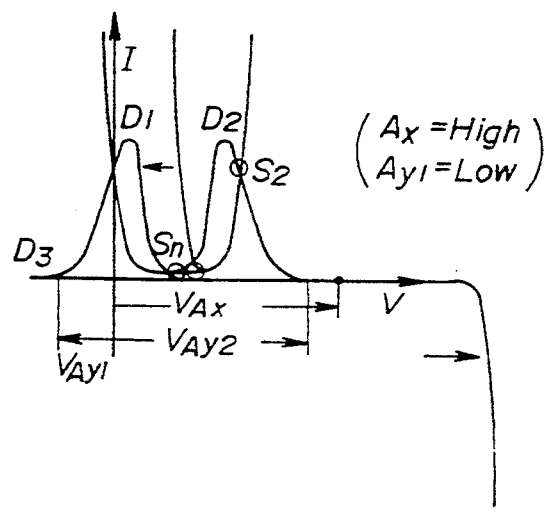

In the write operation on the stable operating point S2, a high-level signal is applied to the row address signal line Ax, and/or a low-level signal is applied to the column address signal line Ay1, as shown in FIGS. 13A, 13B and 13C. When no signals are applied to the row address signal line Ax and the column address signal line Ay1, the memory cell is maintained in the hold state shown in FIG. 6. It is also possible for the memory cell to be maintained in the state shown in FIG. 7B in which the high-level signal is applied to the row address signal line Ax and the potential of the column address signal line Ay1 is low to some extent. When the potential of the row address signal line is made low, as shown in FIG. 13A the characteristic curve of the diode D3 is shifted rightwards, and the potential VAx+Vth1 is increased. On the other hand, when the potential of the column address signal line Ay1 is made low, as shown in FIG. 13B the characteristic curve of the diode D1 is shifted leftwards, and the potential VS1 is decreased.

The magnitudes of the voltages are determined so that the memory cell is maintained in the state shown in FIG. 6 or FIG. 7A when either the potential of the line Ax or the potential of the line Ay2 is switched, and are determined so that the condition VAx+Vth1>VSn is satisfied when the potentials of both the lines Ax and Ay1 are switched in the above-mentioned manner. As a result, only the stable operating point S2 exits in only the memory cell connected to the address signal lines Ax and Ay1 that cross, and is located at a voltage lower than the peak voltage applied to the diode D2. When the potentials of the address signal lines Ax and Ay1 are switched to the original levels, the stable operating point is S2 and information can be written into memory cell at the stable operating point S2.

In short, FIG. 13A shows a characteristic obtained when a high-level signal is applied to only the row address signal line Ax, FIG. 13B shows a characteristic obtained when a low-level signal is applied to only the column address signal line Ay1, and FIG. 13C shows a characteristic obtained when the high-level signal is applied to the row address signal line Ax and the low-level signal is applied to the column address signal line Ay1.

When information is read from the stable operating point S1 or S2, a positive potential or a potential of zero is applied to the standby signal line Sb. Hence, an extension of the depletion layer from the gate G can be reduced, and the currents flowing in the negative-differential conductance diodes D1 and D2 increase, as shown in FIG. 9B, and the speed at which information is read from the stable operating point S1 or S2 can be improved.

It is preferable that when information is written into the memory cell, the standby signal line Sb is controlled in the same manner as in the standby mode.

When information is written into the stable operating point S1, an alternative condition (Ax: low, Ay1 and Ay2: high) or (Ax: low, Ay1: high) can be employed. In this case, the condition for writing information into the memory cell cannot be obtained by applying the voltage to either the row or column address signal line. In this case, Ax+Vth2>Vsn is satisfied. When the voltages are applied to both the row and column address signal lines, the writing condition Ax+Vth2<Vsn can be obtained.

When information is written into the stable operating point S2, an alternative condition (Ax: high, Ay1: low) or (Ax: high, Ay1, Ay2: low) can be employed. In this case, the condition for writing information into the memory cell cannot be obtained by applying the voltage to either the row or column address signal line. In this case, Ax+Vth1<Vsn is satisfied. When the voltages are applied to both the row and column address signal lines, the writing condition Ax+Vth1>Vsn can be obtained.

In the above description, the initial state of the read operation is the same as the hold state (this is because, normally, a minimum mount of power is consumed in the hold state and the setting of another potential is not needed). However, the initial state may not necessarily coincide with the hold state as long as the above-mentioned conditions are satisfied.

(v) PHYSICAL STRUCTURE OF MEMORY CELL

Figure 14:
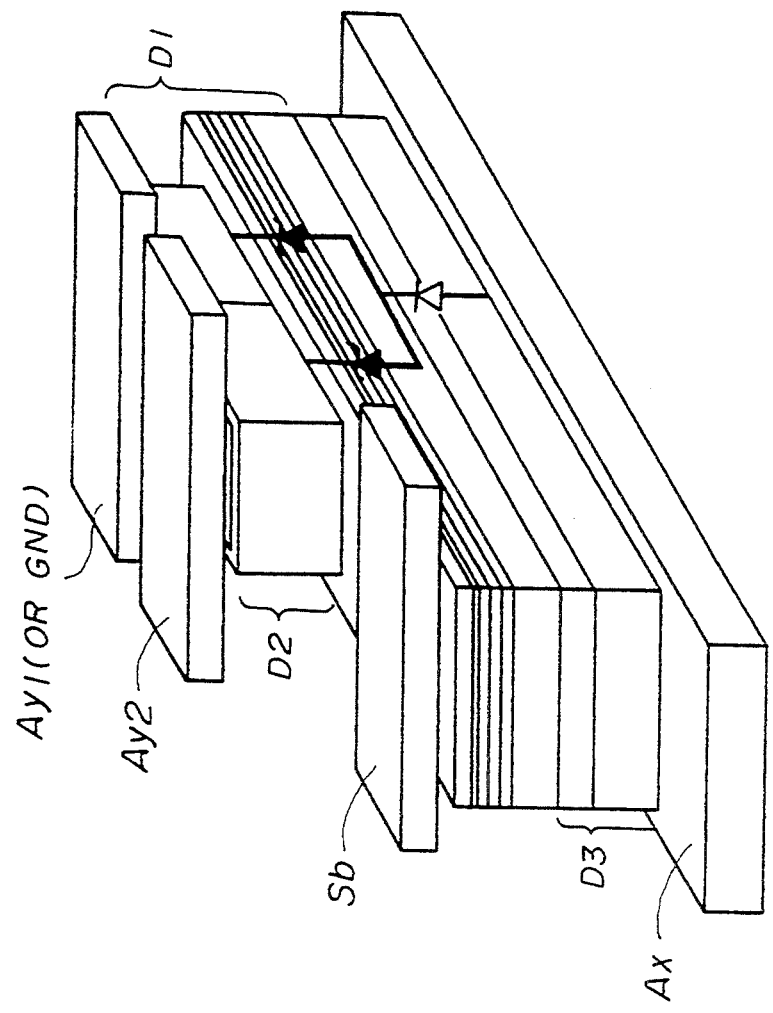
FIG. 14 is a perspective view of the memory cell.

FIG. 14 is a perspective view of the memory cell. As shown in FIG. 14, a layer of the row address signal line Ax is disposed in a first direction, and layers of the pair of column address signal lines Ay1 and Ay2 are disposed in parallel in a second different direction so as to cross the row address line layer Ax. A layer of the standby signal line Sb is disposed in parallel with the column address signal line layers Ay1 and Ay2. A memory cell MC is formed at crossing parts at which the row address signal line layer Ax crosses the column address signal line layers Ay1 and Ay2.

The threshold diode D3 is formed between the address signal line layer Ax and the address signal line layers Ay1 and Ay2, and has a first surface which is in contact with the row address signal line layer Ax. The threshold diode D3 flows the current to the row address signal line layer Ax on the basis of the threshold voltages Vth1 and Vth2. The negative-differential conductance diode D1 has stacked layers interposed between a second surface of the threshold diode D3, opposite to the first surface thereof, and the column address signal line layer Ay1 and electrically connected to the second surface and the column address signal line layer Ay1. The negative-differential conductance diode D2 has stacked layers interposed between the second surface of the threshold diode D3 and the column address signal line layer Ay2 and electrically connected to the second surface and the column address signal line layer Ay2. A gate electrode G is formed in the periphery of the negative-differential conductance diodes D1 and D2. The gate electrode G extends or contracts the depletion layer in response to the voltage applied thereto in order to control the current flowing in the diodes D1 and D2. The gate electrode G is electrically connected to the standby signal line layer Sb.

The negative-differential conductance diodes D1 and D2 are formed of resonant-tunneling diodes.

Figure 15B:
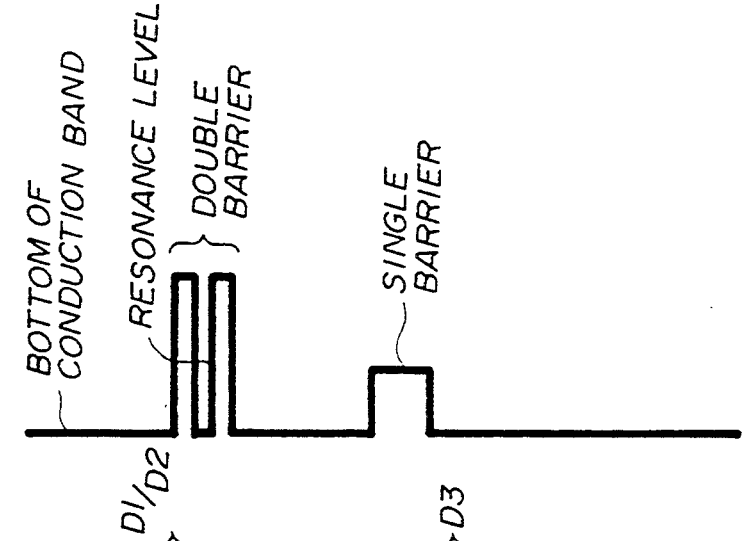
FIG. 15B is an energy band diagram of the memory cell shown in FIGS. 14 and 15A.
Figure 15A:
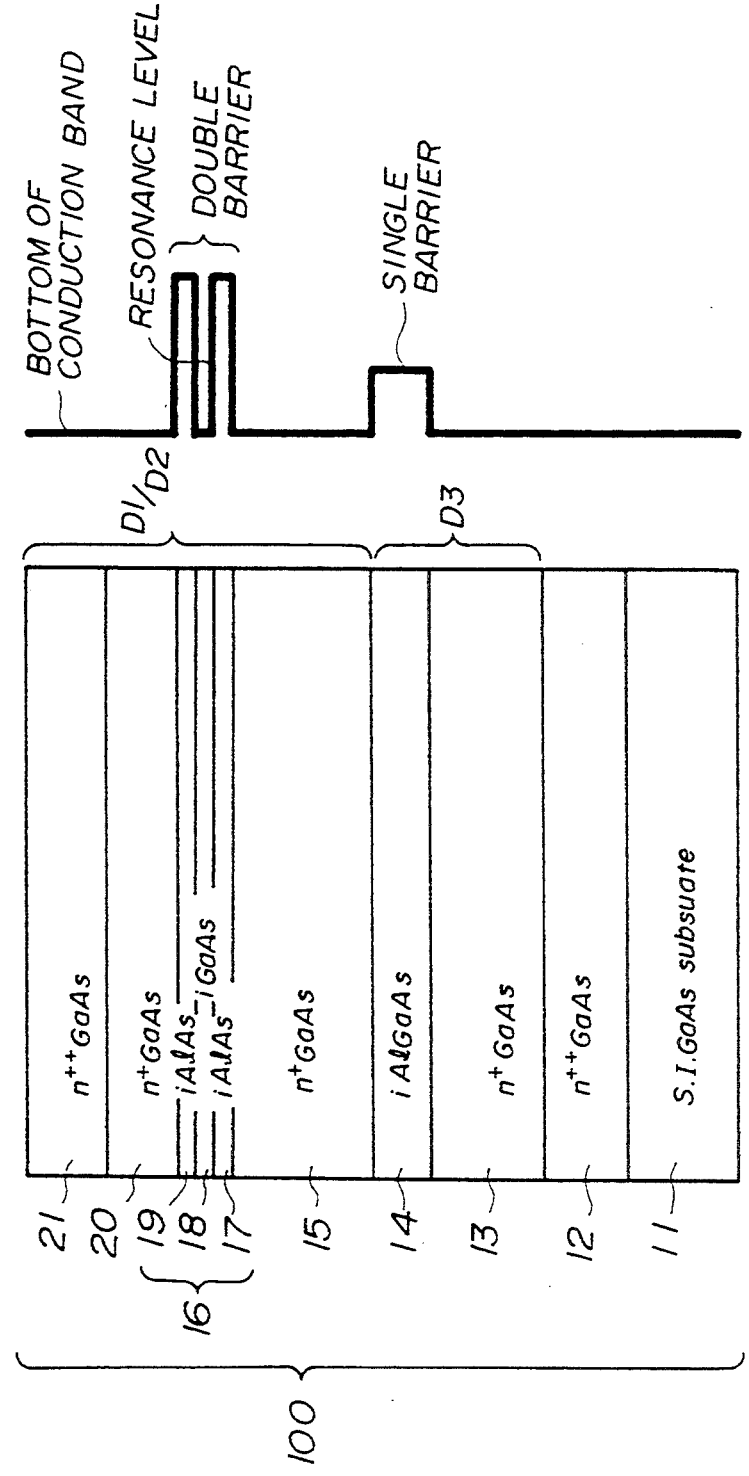
FIG. 15A is a cross-sectional view of the memory cell shown in FIG. 14.

FIG. 15A is a cross-sectional view of a semiconductor layer 100 forming the negative-differential conductance diodes D1 and D2 and the threshold diode DS, and FIG. 15 is an energy band diagram of the semiconductor layer 100.

As shown in FIG. 15A, on a semi-insulating or intrinsic insulating substrate (GaAs) 11, there are stacked a good-conductor layer (n++-type GaAs) 12, a conductor layer (n+-type GaAs) 13, a single-barrier layer (i-AlGaAs) 14, a good-conductor layer (n+-type GaAs) 15, a resonant-tunneling barrier layer (i-AlAs/i-GaAs/i-AlAs) 16, a conductor layer (n+-type GaAs) 20, and a good-conductor layer (n++-type GaAs) 21. The resonant-tunneling barrier layer 16 has a resonant-tunneling structure in which a quantum well layer (i-GaAs) 18 is sandwiched between tunnel barrier layers (i-AlAs) 17 and 19.

The conductor layer (n+-type GaAs) 15 and the single-barrier layer (i-AlGaAs) 14 are joined together so that the threshold diode D3 is formed. The resonant-tunneling diodes, that is, the negative-differential conductance diodes D1 and D2 are formed so that the resonant-tunneling barrier layer (i-AiAs/i-GaAs/i-Alas) 16 is sandwiched between the good-conductor layer (n+-type GaAs) 15 and the conductor layer (n+-type GaAs) 20 and the good-conductor layer (n++-type GaAs) 21.

As described above, the negative-differential conductance diodes D1 and D2 have the resonant-tunneling structure and the gate electrode G, connected to the standby signal line layer Sb, is formed above the resonant-tunneling barrier layer (i-AlAs/i-GaAs/i-AlAs) 16 in the periphery of the diodes D1 and D2. Hence, when the gate electrode G is set at a negative potential, the depletion layer from the gate electrode G is extended and thereby the effective area of the resonant-tunneling barrier is reduced. Hence, the current flowing in the diodes D1 and D2 is reduced.

On the contrary, when the gate electrode G, is set at a positive potential, the depletion layer from the gate electrode G is contracted and thereby the effective area of the resonant-tunneling barrier is increased. Hence, the currents flowing in the diodes D1 and D2 are increased. Even if the gate electrode G is not formed, the depletion layer is formed due to a surface level formed at the surface of the conductor layer (n+-type GaAs) 20, and hence the effective area of the resonant-tunneling barrier is reduced to some extent. Hence, even if the gate electrode G is not set at a positive potential but, instead, at zero, the depletion layer can be contracted so that the effective area of the resonant-tunneling barrier can be increased.

Hence, as shown in FIGS. 9A and 9B, it is possible to reduce the level of power consumed in the memory cell by setting, in the standby mode, the gate electrode G at a negative potential to thereby reduce the current flowing in the diodes D1 and D2. In the read/write operation, it is possible to increase the read/write speed by setting the potential of the gate electrode at a positive potential or zero to thereby increase the current flowing in the diodes D1 and D2.

It should be noted that the currents flow in the diodes D1 and D2 in the opposite directions, even though the diodes D1 and D2 have the same layer structure, as will be seen from FIG. 14. Hence, when fabricating memory cells, it is necessary to appropriately determine the materials of the layers 17, 18 and 19 forming the resonant-tunneling barriers and the thicknesses thereof so that the diodes D1 and D2 have the negative-differential conductance characteristics irrespective of whether the respective current flows in the memory cell structure are upwards or downwards.

[II] SRAM

Figure 16:
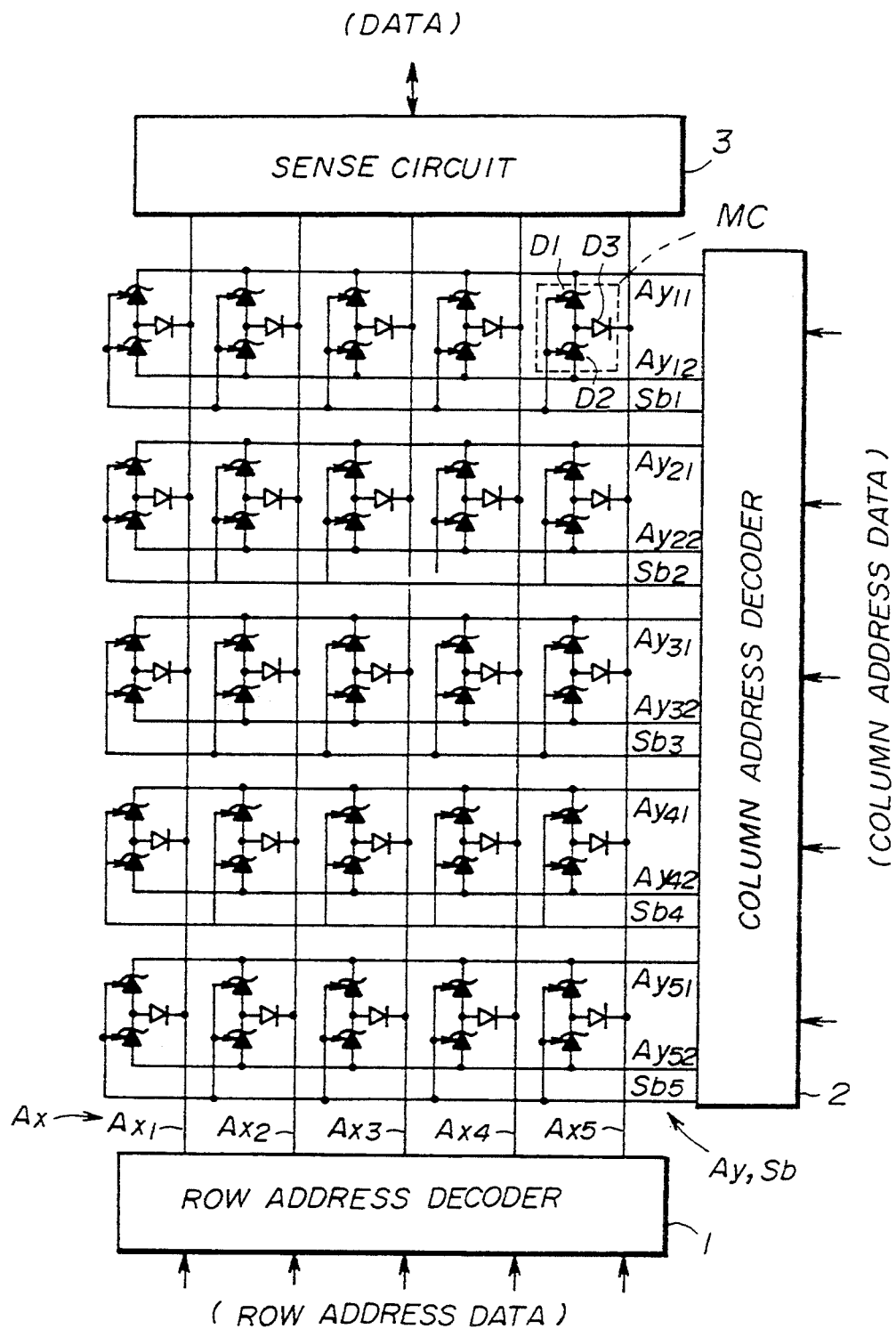
FIG. 16 is a block diagram of an SRAM according to the present invention.

FIG. 16 shows an SRAM using memory cells, each having the structure shown in FIG. 1.

As shown in FIG. 16, a group of row address signal lines Ax1–Ax5 is disposed in a first direction, and a group of pairs of column address signal lines (Ay11, Ay12)–(Ay51, Ay52) is disposed in a second different direction and so as to cross the lines Ax1–Ax5 without making electrical connections thereto. A group of standby signal lines Sb1–Sb5 are disposed in parallel with the column address signal lines Ay11–Ay52. Memory cells MC are respectively provided at cross points at which the row address signal lines Ax1–Ax5 cross the column address signal lines Ay11–Ay52. Each of the memory cells MC is made up of the negative-differential conductance diodes D1 and D2, the threshold diode D3 and the gate G for controlling the currents flowing in the diodes D1 and D2, as shown in FIGS. 1 and 16.

First ends of the row address signal lines Ax1–Ax5 are connected to a row address decoder 1, which decodes row address data and applies voltages corresponding to the content of the decoded data to the row address signal lines Ax1–Ax5. Second ends of the row address signal lines Ax1–Ax5 are connected to a sense amplifier circuit 3, which detects currents flowing in the row address signal lines and reads information from the memory cells MC.

Ends of the column address signal lines Ay11–Ay52 and ends of the standby signal lines Sb1–Sb5 are connected to a column address decoder 2, which decodes column address data and applies voltages, corresponding to the content of the decoded data, to the column address signal lines and which applies predetermined voltages to the gates G on the basis of which one of the read, write and standby operations should be carried out.

Information can be written into a desired memory cell MC by applying the corresponding row and column address data to the row address decoder 1 and the column address decoder 2 to thereby select the desired memory cell MC. In the write operation, a positive potential or a zero-potential is applied to the corresponding standby signal line Sb. Hence, the current flowing in the diodes D1 and D2 can be increased, so that information can be written into the desired memory cell at a higher speed. The process and conditions for writing information into a memory cell have been described with reference to FIGS. 3 through FIG. 13C.

Information can be read from a desired memory cell MC by applying the corresponding row and column address data to the row address decoder 1 and the column address decoder 2 to thereby select the desired memory cell MC. The sense amplifier circuit 3 senses and amplifies currents flowing in the row address signal lines Ax1–Ax5. In the read operation, a positive potential or a zero-potential is applied to the corresponding standby signal line Sb. Hence, the currents flowing in the diodes D1 and D2 can be increased, so that information can be read from the desired memory cell at a higher speed. The process and conditions for reading information from a memory cell have been described with reference to FIGS. 3 through FIG. 13C.

Figure 17:
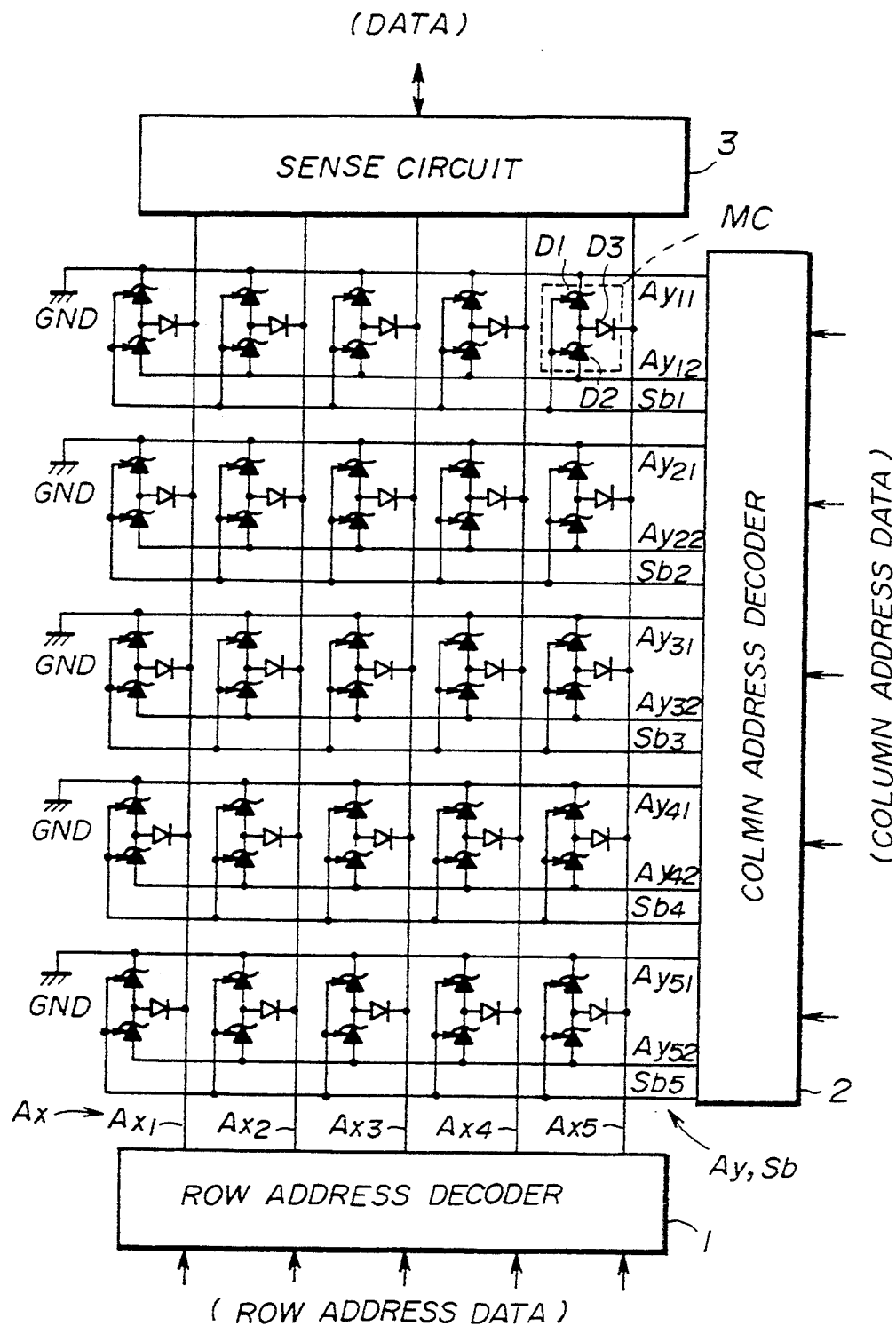
FIG. 17 is a block diagram of another SRAM according to the present invention.

FIG. 17 shows an SRAM having memory cells, each having the structure shown in FIG. 2. In FIG. 17, parts that are the same as those shown in FIG. 16 are given the same reference numbers as previously. As shown in FIG. 17, the column address signal lines Ay11, AY21, . . . , Ay51 are grounded and hence set at the ground potential.

Figure 18:
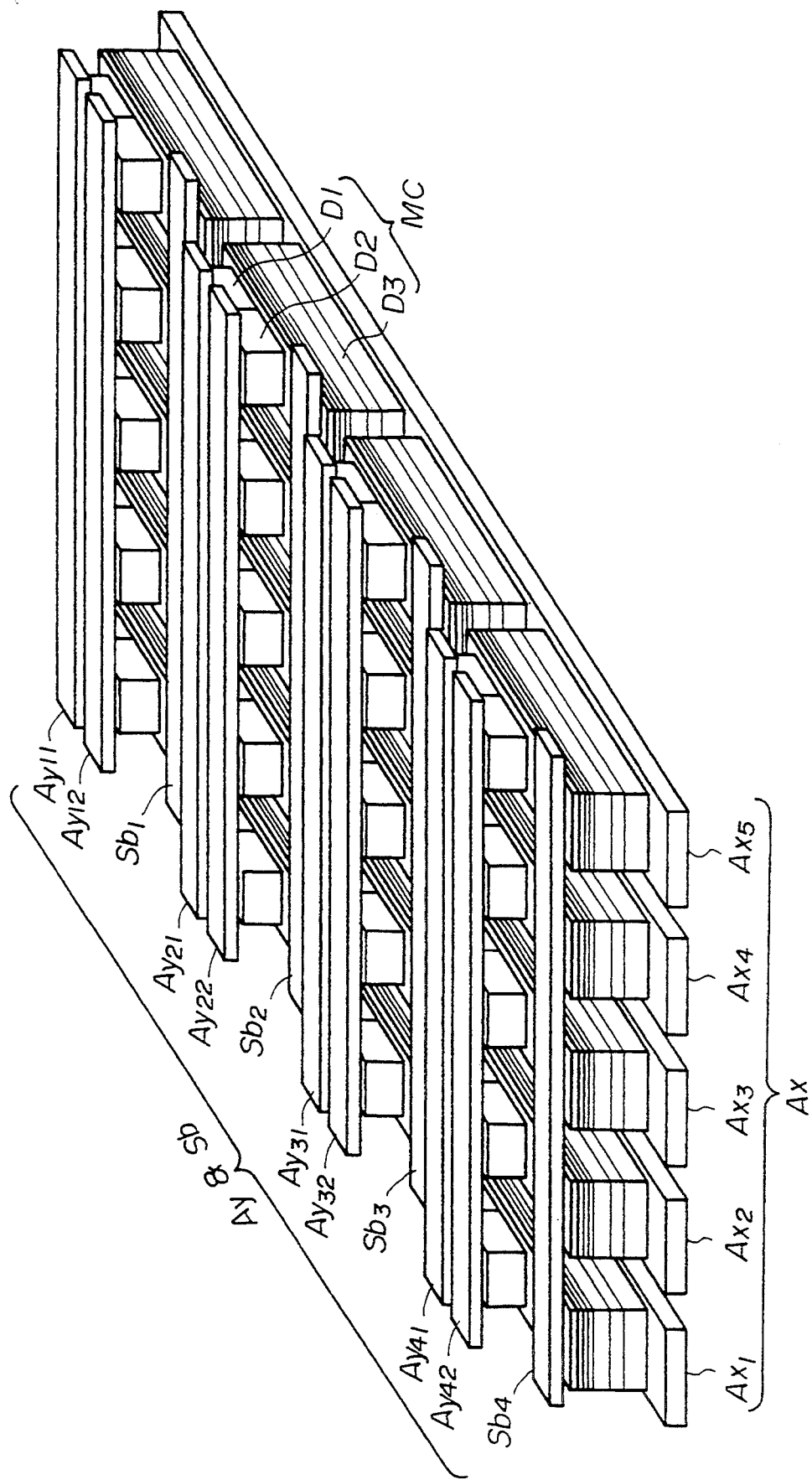
FIG. 18 is a perspective view of the SRAM shown in FIG. 16.
Figure 19:
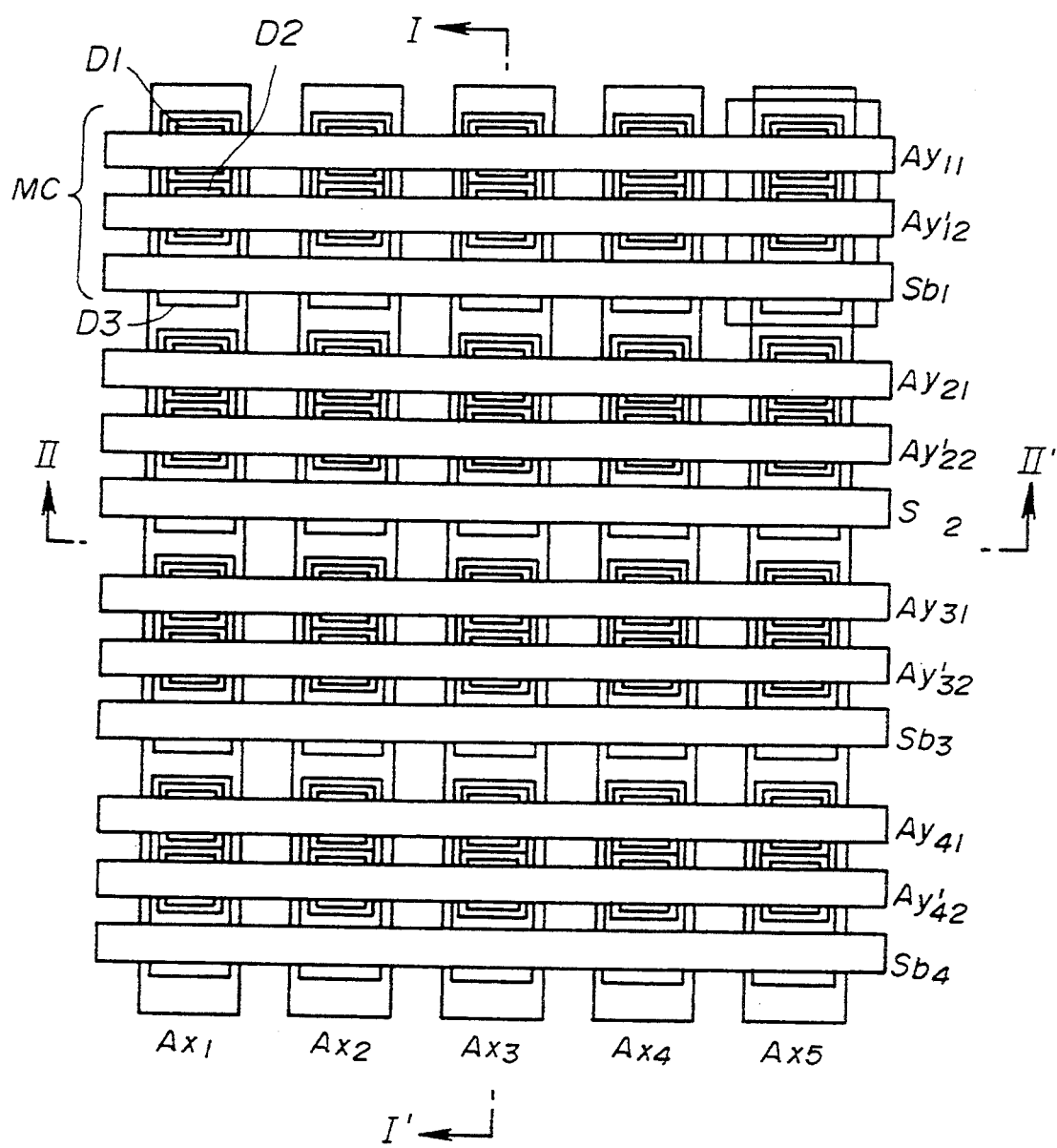
FIG. 19 is a plan view of the SRAM shown in FIG. 16.

FIG. 18 is a perspective view of the SRAM shown in FIG. 16 using the memory cell structure shown in FIG. 1, and FIG. 19 is a plan view thereof. As shown in FIG. 18, layers of the row address signal lines Ax1–Ax5 are formed in parallel with each other, and layers of the pairs of column address signal lines (Ay11, Ay12)–(Ay51, Ay52) are formed at predetermined intervals. Further, layers of the standby signal lines Sb1–Sb4 are formed in parallel with the column address signal lines Ay11–Ay52.

The threshold diodes D3 are respectively formed on the row address signal line layers Ax1–Ax5, each of the diodes D3 having a length approximately equal to the sum of the length between the opposite ends of the relevant pair of column signal address line layers (Ay11 and Ay12, for example) and the width of the relevant standby signal line layer Sb. One surface of each of the threshold diodes DS is electrically connected to the corresponding row address signal line Ax. Each of the negative-differential conductance diodes D2 is interposed between a first-end area of the other surface of the corresponding threshold diode DS and the corresponding column address signal line layer Ayn2 ($n=1-5$). Similarly, each of the negative-differential conductance diodes D1 is interposed between a second-end area of the other surface of the corresponding threshold diode D3 and the corresponding column address signal line layer Ayn1. The diodes D2 are electrically connected to the respective column address signal line layers Ayn2, and the diodes D1 are electrically connected to the respective column address signal line layers Ayn1.

The gate electrode G for controlling the currents flowing in the associated diodes D1 and D2 is formed in the periphery of the associated diodes D1 and D2, and is electrically connected to the corresponding one of the standby signal line layers Sb1–Sb4.

As described above, a stacked layer including the diodes D1, D2 and D3 is formed so as to be sandwiched between the corresponding row address signal line layer Ax and the corresponding column address signal line layers Ay. Hence, as shown in FIG. 19, one memory cell MC can be formed in a size approximately equal to the sum of the widths of the two diodes D1 and D2 and the width of the standby signal line layer Sb. As a result, the memory cells MC can be highly integrated.

Figure 20:
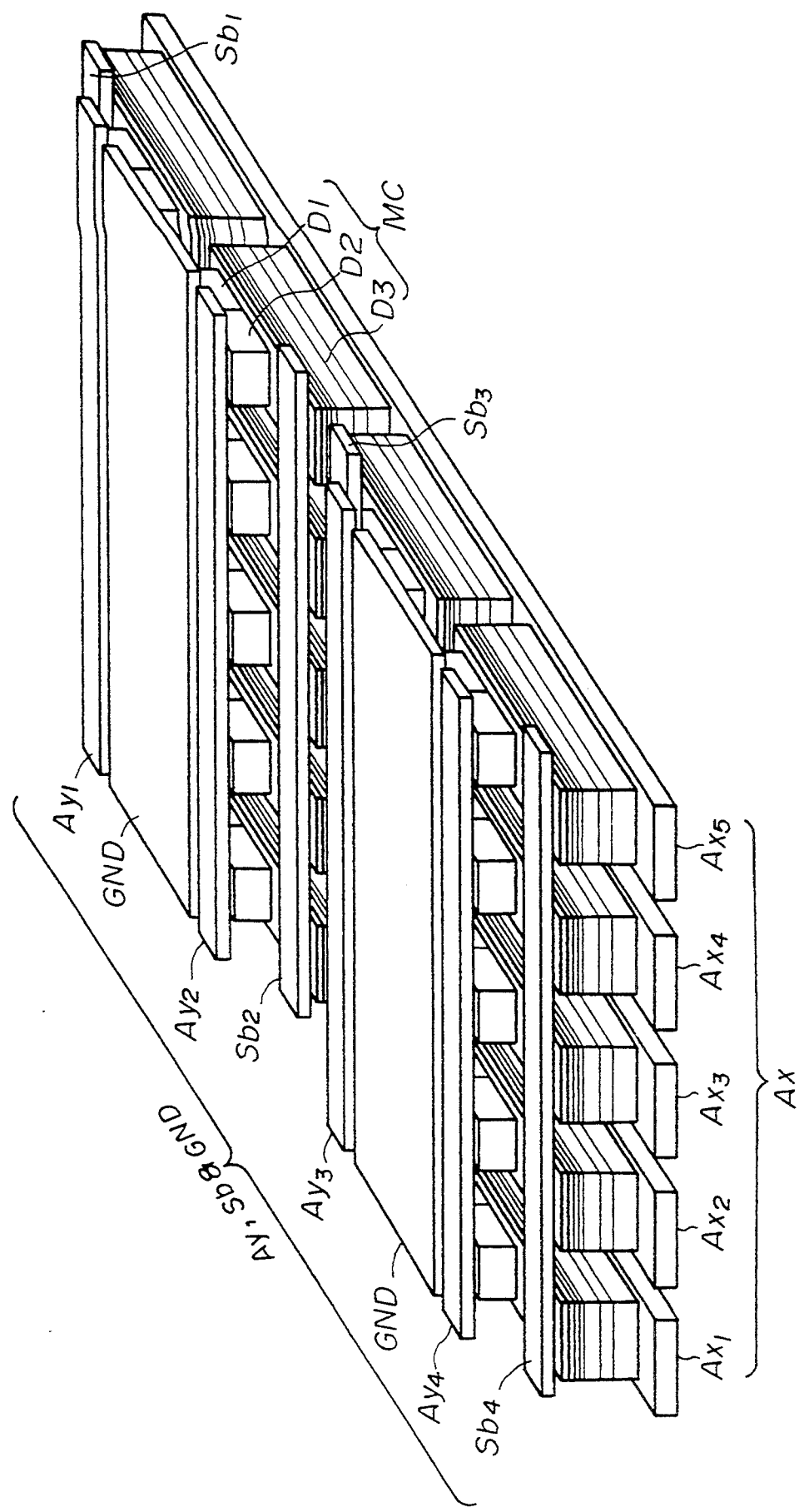
FIG. 20 is a perspective view of the SRAM shown in FIG. 17.
Figure 21:
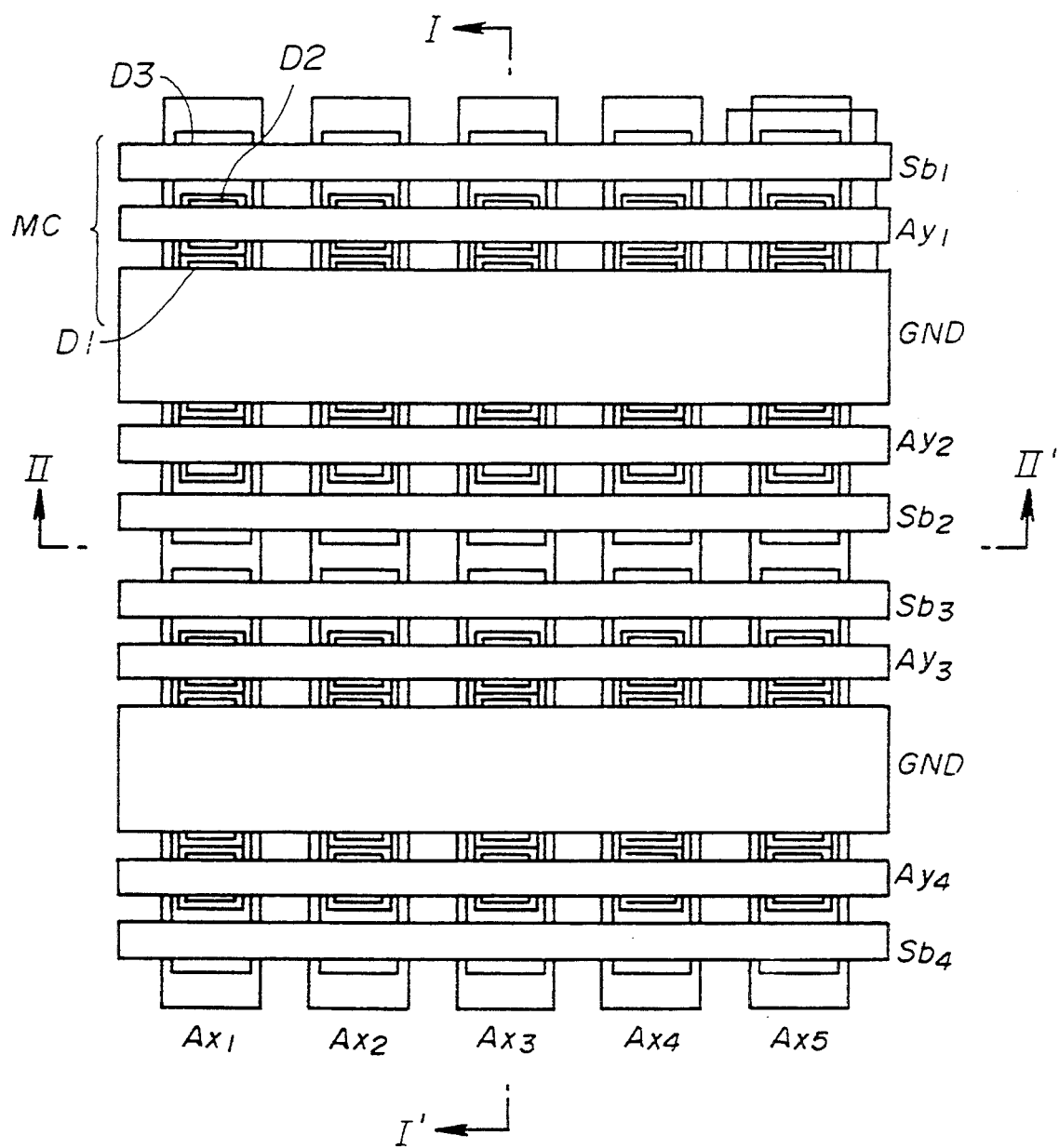
FIG. 21 is a plan view of the SRAM shown in FIG. 17.

FIG. 20 is a perspective view of the SRAM shown in FIG. 17 having the memory cell structure shown in FIG. 2, and FIG. 21 is a plan view thereof. In FIGS. 20 and 21, parts that are the same as those shown in the previously described figures are given the same reference numbers. As shown in FIG. 20, the column address signal line layers Ax11 and Ax21 shown in FIG. 18 are formed by a single ground layer GND.

[III] PRODUCTION METHOD

A description will now be given, with reference to FIGS. 22A through. 22S, of a method of producing the aforementioned SRAMs.

The production method primarily comprises a step of growing the semiconductor layer 100, an etching step of forming the two negative-differential conductance diodes D1 and D2, a step of forming the threshold diode D3, a step of forming the row address signal lines Ax, and a step of forming the row address signal lines Ay and the standby signal lines Sb.

The semiconductor layer 100 is epitaxially grown. That is, as shown in FIG. 15A, on the semi-insulating or intrinsic insulating substrate (GaAs) 11, are there grown the good-conductor layer ($n^{++}$-type GaAs) 12, the conductor layer ($n^+$-type GaAs) 13, the single-barrier layer (i-AlGaAs) 14, the good-conductor layer ($n^+$-type GaAs) 15, the resonant-tunneling barrier layer (i-AlAs/i-GaAs/i-AlAs) 16, the conductor layer ($n^+$-type GaAs) 20, and the good-conductor layer ($n^{++}$-type GaAs) 21.

Figure 22L:
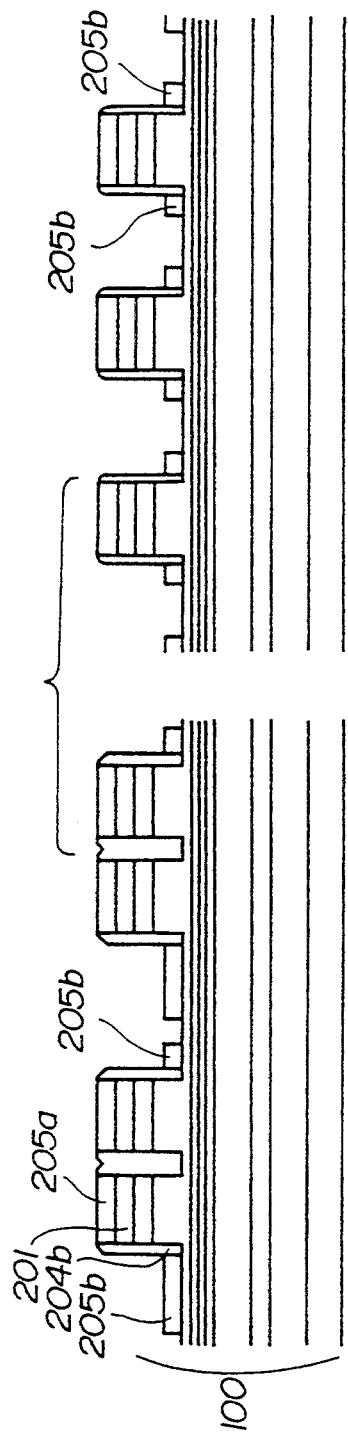
Figure 22M:
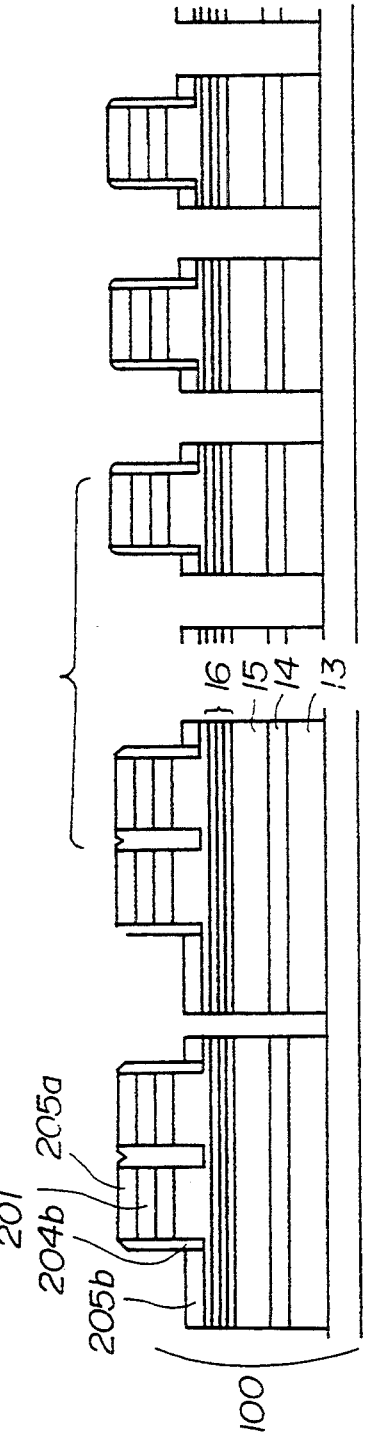
Figure 22R:
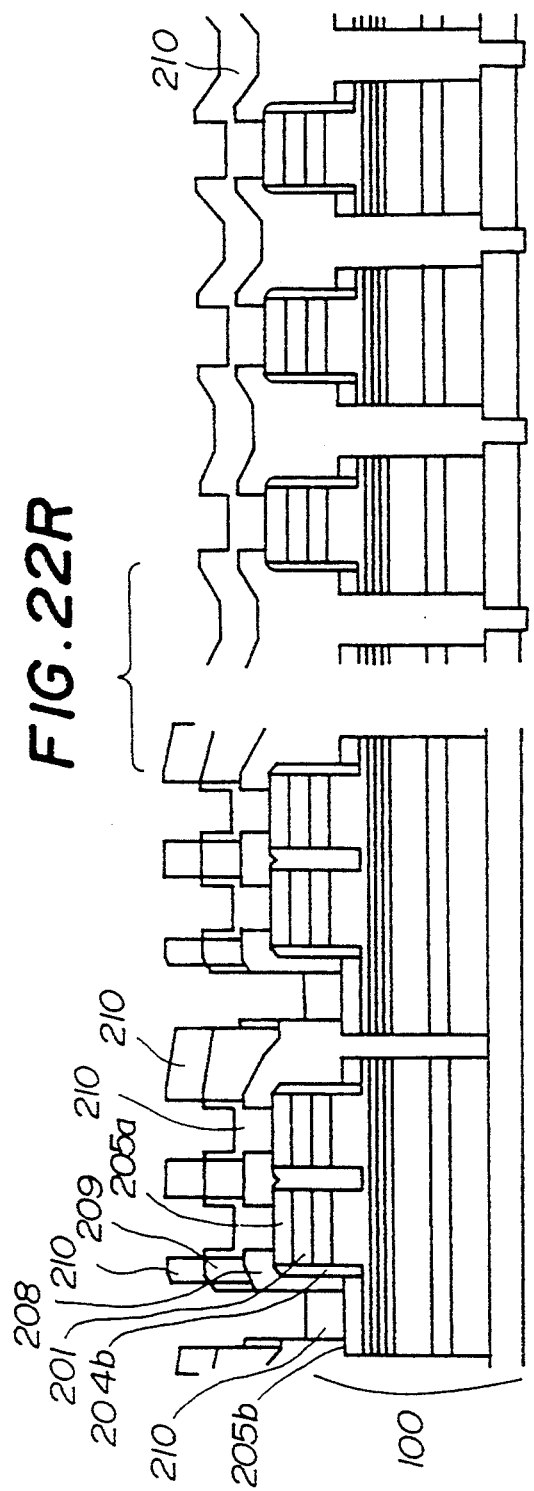
Figure 22S:
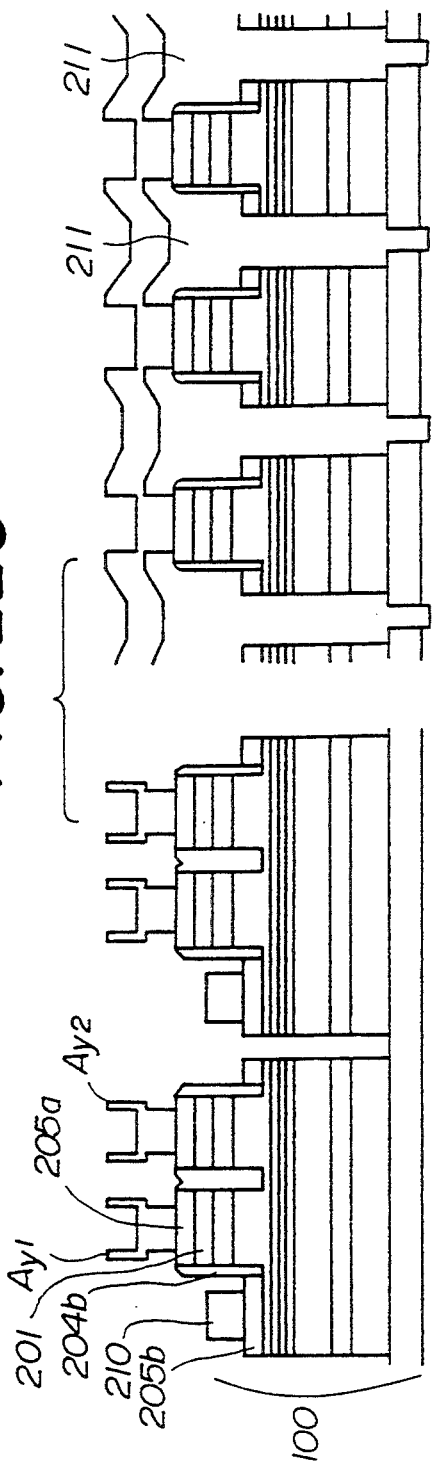

A left part of each of FIGS. 22A through 22S is a cross-sectional view taken along a line I-I' shown in FIG. 19, and a right part of each thereof is a cross-sectional view taken along a line II-II' shown in FIG. 19.

First, the semiconductor layer 100 is epitaxially grown. The structure of the semiconductor layer 100 is shown in FIG. 15A. Next, a metallic film 201 is evaporated on the good-conductor layer 21 as shown in FIG. 22A, and an insulating film 202 is grown on the metallic film 201 as shown in FIG. 22B. Thereafter, a patterned resist 203 is formed on the insulating film 202 in order to pattern the negative-differential conductance diodes D1 and D2, as shown in FIG. 22C.

As shown in FIG. 22D, the insulating film 202 is etched, using the resist 203 as a mask, and the resist 203 is removed. Subsequently, as shown in FIG. 22E, the metallic film 201 is etched using the insulating film 202 as a mask. Then, as shown in FIG. 22F, the good-conductor layer 21 and the conductor layer 20 of the semiconductor layer 100 are etched. Thereby, the patterns of the negative-differential conductance diodes D1 and D2, each having the resonant-tunneling barrier layer 16 sandwiched between at one surface thereof the combination of the good-conductor layer 21 and the conductor layer 20 and, at the other the conductor layer 15.

Then, as shown in FIG. 22G, an insulating film 204 is grown which has a thickness embedding, and thereby filing the space between the negative-differential conductance diodes D1 and D2. Thereafter, as shown in FIG. 22H, the insulating film 204 is anisotropically etched. Thereby, insulating films 204a embedding the spaces between the diodes D1 and D2 isolate the diodes D1 and D2 from each other, and sidewalls 204b are formed which covers corresponding sidewalls of the good-conductor layer 21 and the conductor layer 20.

Subsequently, as shown in FIG. 22I, the insulating films 202 formed on the metallic films 201 are selectively etched. Then, as shown in FIG. 22J, a metallic film is evaporated and separated, so that metallic films 205a are formed on the metallic films 201 and simultaneously gate electrodes 205b are formed on the conductor layer 20 exposed in the periphery of the diodes D1 and D2 covered by the sidewalls 204b.

Then, as shown in FIG. 22K, a resist 206 is formed and a patterning process for forming the threshold diodes D3 is carried out. Subsequently, as shown in FIG. 22L, the gate electrodes 205b are etched using the resist 206 as a mask, and the resist 206 is removed.

Thereafter, as shown in FIG. 22M, the conductor layer 20, the resonant-tunneling barrier layer 16, the conductor layer 15, the single-barrier layer 14 and the conductor layer 13 of the semiconductor layer 100 are etched using the metallic films 205 and the gate electrodes 205b as a mask. Hence, the pattern of the threshold diodes D3, each having the conductor layer 15 and the single-barrier layer 14 joined together, is formed.

Then, as shown in FIG. 22N, the pattern of the row address signal lines Ax is formed using a resist 207. Subsequently, as shown in FIG. 22O, the good-conductor layer 12 of the semiconductor layer 100 is etched using the resist 207 as a mask, and then the resist 207 is removed. Thereby, the pattern of the row address signal lines Ax made of the good-conductor layer 12 is formed.

Thereafter, as shown in FIG. 22P, a resist (lower layer) 208 and a resistor (upper layer) 209 are coated. Then, as shown in FIG. 22Q, a patterning process for forming the column address signal lines Ay and the standby signal lines Sb is carried out. Then, as shown in FIG. 22R, a metallic film 210 is evaporated on the entire surface. Finality, as shown in FIG. 22S, a lift-off process is performed, so that the pattern of the column address signal lines Ay1 and Ay2 including the metallic films 210 on the metallic films 205a of the diodes D1 and D2 is formed, and simultaneously the pattern of the standby signal lines Sb including the metallic films 210 formed on the gate electrodes 205b is formed. In the above manners, the memory cells MC, the address signal lines Ax and Ay, and the standby signal lines Sb are formed.

As shown in the right part of FIG. 22S, the resists (lower layers) 208 between adjacent semiconductor layers 100 are removed, and the column address signal lines Ay including the metallic films 210 have an air-bridge structure, which provides a space 211 between adjacent memory cells. Since the dielectric constant of the space is equal to 1, the parasitic capacitance of the air-bridge structure is less than that of a structure in which the space between the column address signal lines Ay are filled with the resists (lower layers) 208.

In the above-mentioned embodiment of the present invention, the memory cell MC uses a GaAs semiconductor, and the barrier layer is formed with an $Al_xGa_{1-x}As$ layer. However, the present invention is not limited to such compound semiconductors, and can use an InGaAs semiconductor using, as a barrier layer, $In_xAl_{1-x}As$. Further, the present invention is not limited to structures using semiconductor materials, and includes a memory cell using a metallic material. For example, the present invention includes a memory cell in which the row address signal lines Ax are made of a metallic material such as nickel/aluminum, and are combined with semiconductor materials. By forming the row address signal lines Ax with a metallic material, it becomes possible to reduce an unwanted influence (a delay in signal transfer) caused by resistance loss of the signal lines. It is also possible to form the resonant-tunneling diodes and/or threshold diodes with a metallic material (nickel/aluminum, for example).

The present invention is not limited to the specifically described embodiments, and variations and modifications may be made without departing from the scope of the present invention.

What is claimed is:

1. A memory device comprising:
   a first address signal line;
   a pair of second address signal lines;
   a standby signal line; and
   a memory cell provided at a cross point at which the first address signal line crosses the pair of second address signal lines, said memory cell comprising:
      first and second elements connected, via a connection node, in series between the pair of second address signal lines and in a forward direction, each of the first and second elements having a negative-differential conductance characteristic,
      a threshold diode connected between the first address signal line and the connection node, the threshold diode having a characteristic in accordance with which a current flows in the threshold diode when a voltage applied across the threshold diode exceeds one of a positive and a negative threshold voltages, and
      a gate which is connected to the standby signal line and controls currents flowing in the first and second elements.

2. The memory device as claimed in claim 1, wherein:
   the current flows in the threshold diode when a voltage equal to or higher than the positive threshold voltage is applied across the threshold diode and when a voltage equal to or lower than the negative threshold voltage is applied across the threshold diode.

3. The memory device as claimed in claim 1, wherein:
   the first address signal line comprises a first layer;
   the threshold diode has a first portion connected to the first layer, and a second portion;
   the first element has a first portion connected to the second portion of the threshold diode, and a second portion;
   the second element has a first portion connected to the second portion of the threshold diode, and a second portion;
   the second portion of the first element is located above and connected to one of the pair of second address signal lines;
   the second portion of the second element is located above and connected to the other one of the pair of second address signal lines; and
   the gate includes a gate electrode located above resonant-tunneling barrier layers of the first and second elements.

4. The memory device as claimed in claim 1, wherein the memory device is maintained in one of a first stable operating point, located at a valley portion of a current-voltage characteristic curve of the first element, and a second stable operating point, located at a valley portion of a current-voltage characteristic curve of the second element.

5. The memory device as claimed in claim 1, wherein one of the pair of second address signal lines is grounded.

6. The memory device as claimed in claim 1, further comprising means for setting the standby signal line to a first potential, thereby causing currents flowing in the first and second elements to be increased when information is read from or written into the memory cell and for setting the standby signal line to a second potential, thereby causing the currents flowing in the first and second elements to be decreased when information is held in the memory cell.

7. A method for reading information from a memory device comprising a first address signal line, a pair of second address signal lines, a standby signal line and a memory cell provided at a cross point at which the first address signal line crosses the pair of second address signal lines, said memory cell comprising first and second elements connected, via a connection node, in a series circuit between the pair of second address signal lines in a forward direction, each of the first and second elements having a negative-differential conductance characteristic, a threshold diode connected between the first address signal line and the connection node, the threshold diode having a characteristic in which a current flows when a voltage applied across the threshold diode exceeds one of a positive threshold voltage and a negative threshold voltage, and a gate which is connected to the standby signal line and controls currents flowing in the first and second elements, said method comprising the steps of:

applying voltages to the pair of second address signal lines so that two stable operating points and an unstable operating point are formed by the series circuit of the first and second elements in accordance with the voltages applied to the pair of second address signal lines; and applying a Voltage to the first address signal line such that a potential of the connection model corresponding to one of the stable operating points, with respect to the first address signal line is outside a voltage range between the negative threshold voltage and the positive threshold voltage and a potential of the connection node corresponding to the unstable operating point with respect to the first address signal line is within said voltage range.

8. The method as claimed in claim 7, further comprising the step of applying a voltage to the gate so that the currents flowing in the first and second elements are increased.

9. The method as claimed in claim 7, further comprising:

(a) applying the voltages to the first address signal line and the pair of second address signal lines so that the potential of the connection node, corresponding to one of the two stable operating points, on a negative-potential side with respect to the first address signal line is lower than the negative threshold voltage and the potential of the connection node, corresponding to the unstable operating point, with respect to the first address signal line is higher than the negative threshold voltage when information corresponding to said one of the two stable operating points on the negative-potential side is read from the memory cell;

(b) applying the voltages to the first address signal line and the pair of second address signal lines so that the potential of the connection node, corresponding to one of the stable operating points, on a positive-potential side with respect to the first address signal line is higher than the negative threshold voltage and the potential of the connection node corresponding to the unstable operating point, with respect to the first address signal line is lower than the negative threshold voltage when information corresponding to said one of the two stable operating points on the positive-potential side is read from the memory cell;

(c) applying a first voltage to the standby signal line so that currents flowing in the first and second elements are increased in the steps (a) and (b); and (d) applying a second voltage to the standby signal line so that the currents flowing in the first and second elements are decreased when information is held in the memory cell.

10. The method as claimed in claim 9, wherein:

said step (a) comprises the steps of applying a high-level signal to the first address signal line, and applying a low-level signal lower than the high-level signal to one of the pair of second address signal lines;

said step (b) comprises the steps of applying a low-level signal to said one of the pair of second address signal lines and applying a high-level signal to the other one of the pair of second address signal lines;

said step (c) comprises the step of setting the standby signal line at a zero or positive potential; and said step (d) comprises the step of setting the standby signal line at a negative potential.

11. The method as claimed in claim 9, wherein:

said step (a) comprises the steps of applying a high-level signal to the first address signal line, and applying a low-level signal lower than the high-level signal to both of the pair of second address signal lines;

said step (b) comprises the steps of applying a low-level signal to one of the pair of second address signal lines, and applying a high-level signal to the first address signal line;

said step (c) comprises the step of setting the standby signal line at a zero or positive potential; and said step (d) comprises the step of setting the standby signal line at a negative potential.

12. A method for writing information into a memory device comprising first and second elements connected, via a connection node, in a series circuit between a pair of second address signal lines in a forward direction, each of the first and second elements having a negative-differential conductance characteristic, a threshold diode connected between the first address signal line and the connection node, the threshold diode having a characteristic in which a current flows when a voltage applied across the threshold diode exceeds one of a positive threshold voltage and a negative threshold voltage and a gate which is connected to the standby signal line and controls currents flowing in the first and second elements, said method comprising the steps of:

applying voltages to the pair of second address signal lines so that two stable operating points and an unstable operating point are formed by the series circuit of the first and second elements; and applying a voltage to the first address signal line so that a potential of the connection node, corresponding to the unstable operating point, with respect to the first address signal line is outside a voltage range between the negative threshold voltage and the positive threshold voltage.

13. The method as claimed in claim 12, further comprising the step of applying a voltage to the gate so that the currents flowing in the first and second elements are increased.

14. The method as claimed in claim 12, wherein said step comprises:

(a) applying the voltages to the first address signal line and the pair of second address signal lines so that the potential of the connection node, corresponding to the unstable operating point, with respect to the first address signal line is higher than the positive threshold voltage when information corresponding to said one of the two stable operating points on the negative-potential side is written into the memory cell;

(b) applying the voltages to the first address signal line and the pair of second address signal lines so that the potential of the connection node, corresponding to the unstable operating point with respect to the first address signal line is lower than the negative threshold voltage when information corresponding to said one of the two stable operating points on the positive-potential side is written into the memory cell; and (c) applying a voltage to the standby signal line so that currents flowing in the first and second elements are increased in the steps (a) and (b) and when information is held in the: memory cell.

15. The method as claimed in claim 12, wherein:

said step (a) comprises the steps of applying a low-level signal to the first address signal line and applying a high-level signal, lower than the high-level signal, to one of the pair of second address signal lines;

said step (b) comprises the steps of applying a high-level signal to the first address signal line and applying a low-level signal to the other one of the pair of second address signal lines;

said step (c) comprises the step of setting the standby signal line at a zero or positive potential; and said step (d) comprises the step of setting the standby signal line at a negative potential.

16. A semiconductor device comprising:

a plurality of first address signal lines;

a plurality of pairs of second address signal lines;

a plurality of standby signal lines extending in parallel with the plurality of pairs of second address signal lines;

a plurality of memory cells provided at cross points at which the plurality of first address signal lines and the plurality of pairs of second address signal line cross;

first address decoder means for supplying first address signals to the plurality of first address signal lines;

second address decoder means for supplying second address signals to the plurality of pairs of second address signal lines and for supplying standby signals to the plurality of standby signal lines; and sense amplifier means for sensing information read from the memory cells to the plurality of first address signal lines, each of the memory cells comprising:

first and second elements connected, via a connection node, in series between one of the pairs of second address signal lines in a forward direction, each of the first and second elements having a negative-differential conductance characteristic;

a threshold diode connected between one of the first address signal lines and the connection node, the threshold diode having a characteristic in accordance with which a current flows in the threshold diode when a voltage applied across the threshold diode exceeds one of a negative threshold voltage and a positive threshold voltage; and a gate which is connected to one of the standby signal lines and controls currents flowing in the first and second elements.

17. The memory device as claimed in claim 16, wherein each of the pairs of second address signal lines is integrally formed and grounded.

18. The memory device as claimed in claim 16, wherein the second decoder means further comprises means for setting one of the standby signal lines at a first potential and thereby causing currents, flowing in the first and second elements of one of the memory cells, to be increased when information is read from or written into said one of the memory cells and for setting said one of the standby signal lines at a second potential and thereby causing the currents, flowing in the first and second elements of said one of the memory cells, to be decreased when information is held in said one of the memory cells.

19. A method of producing a memory device, comprising the steps of:

(a) forming a first address signal line layer;

(b) forming a layer structure of a threshold diode on the first address signal line layer, said layer structure of the threshold diode having a single-barrier layer;

(c) forming a layer structure of a first element and a layer structure of a second element on the layer structure of the threshold diode, each of the first and second elements having a negative-differentiation characteristic, and the layer structure of each of the first and second elements including a double-barrier layer and a gate electrode located at a level higher than that of the double-barrier layer; and (d) forming a pair of second address signal line layers on the respective layer structures of the first and second elements.

* * * * *

UNITED STATES PATENT AND TRADEMARK OFFICE
CERTIFICATE OF CORRECTION

PATENT NO. : 5,438,539
DATED : Aug. 1, 1995
INVENTOR(S) : MORI

It is certified that error appears in the above-indentified patent and that said Letters Patent is hereby corrected as shown below:

Col. 9, line 3, change "11b" to --11B--.

Col. 10, line 30, change "11b" to --11B--;
line 33, change "11b" to --11B--.

Col. 13, line 5, change "DS" to --D3--.

Col. 15, line 5, change "AY21" to --Ay21--;
line 25, change "DS" to --D3--;
line 29, change "DS" to --D3--.

Col. 16, line 7, change "are there" to --there are--;
line 39, after "other" insert --surface thereof,--;
line 48, change "covers" to --cover--.

Col. 18, line 23, after "portion" insert --,--;
line 28, after "portion" insert --,--.

Col. 19, line 16, change "Voltage" to --voltage--
line 17, change "model" to --node,--;
line 22, after "node" insert --,--;
line 23, after "point" insert --,--;
line 52, after "node" insert --,--;
line 67, after "line" delete ",";
line 68, after "signal" insert --,--.

UNITED STATES PATENT AND TRADEMARK OFFICE
CERTIFICATE OF CORRECTION

PATENT NO. : 5,438,539
DATED : Aug. 1, 1995
INVENTOR(S) : MORI

Page 2 of 2

It is certified that error appears in the above-indentified patent and that said Letters Patent is hereby corrected as shown below:

Col. 20, line 1, after "signal" (first occurrence) insert --,--;
line 13, after "line" delete ",";
line 14, after "signal" insert --,--;
line 15, after "signal" (first occurrence) insert --,--;
line 19, after "lines" delete ",";
line 67, after "point" insert --,--.

Signed and Sealed this

Twenty-first Day of November, 1995

Attest:

BRUCE LEHMAN

Attesting Officer

Commissioner of Patents and Trademarks